(12) United States Patent
Shinada et al.

(10) Patent No.: US 7,982,188 B2
(45) Date of Patent: *Jul. 19, 2011

(54) APPARATUS AND METHOD FOR WAFER PATTERN INSPECTION

(75) Inventors: Hiroyuki Shinada, Mitaka (JP); Hisaya Murakoshi, Tokyo (JP); Hideo Todokoro, Hinode (JP); Hiroshi Makino, Kokubunji (JP); Yoshihiro Anan, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/336,895

(22) Filed: Jan. 23, 2006

(65) Prior Publication Data
US 2006/0249676 A1    Nov. 9, 2006

Related U.S. Application Data

(63) Continuation of application No. 10/196,274, filed on Jul. 17, 2002, now Pat. No. 7,022,986.

(30) Foreign Application Priority Data

Jan. 9, 2002    (JP) .................................. 2002-002002

(51) Int. Cl.
*G21K 7/00*    (2006.01)

(52) U.S. Cl. .......................... 250/310; 250/311; 324/751
(58) Field of Classification Search .................... 250/310
See application file for complete search history.

(56) References Cited

U.S. PATENT DOCUMENTS 3,714,425 A * 1/1973 Someya et al. ............... 250/310
4,978,855 A   12/1990 Liebl et al.
(Continued)

FOREIGN PATENT DOCUMENTS
JP    59-192943    4/1983
(Continued)

OTHER PUBLICATIONS

P. Sandland, W.D. Meisburger, D.J. Clark, R.R. Simmons, D.E.A. Smith, L.H. Veneklasen, B.G. Becker, A.D. Brodie, C.H. Chadwick, Z.W. Chen, L.S. Chuu, S.G. Lele, M.Y. Ling, J.E. McMurtry, R.E. Paul, C.S. Pan, M. Robinson, J.K.H. Rough, J. Taylor, P.A. Wieczorek and S.C. Wong, "An electron-beam inspection system for x-ray mask production", J.Vac. Sci. Technol. B9(6), American Vacuum Society, 1991, pp. 3005-3009.

(Continued)

*Primary Examiner* — Phillip A Johnston
(74) *Attorney, Agent, or Firm* — Stites & Harbison PLLC; Juan Carlos A. Marquez, Esq.

(57) ABSTRACT

An electric field for decelerating an electron beam is formed on a surface of a sample semiconductor to be inspected, an electron beam having a specific area (a sheet electron beam) and containing a component having such an energy as not to reach the surface of the sample semiconductor is reflected in the very vicinity of the surface of the sample semiconductor by action of the electric field for deceleration and then forms an image through an imaging lens. Thus images of plural fields on the surface of the sample semiconductor are obtained and are stored in image memory units. By comparing the stored images of the plural fields with one another, the presence and position of a defect in the fields are determined.

18 Claims, 21 Drawing Sheets

U.S. PATENT DOCUMENTS

| | | | |
|---|---|---|---|
| 6,091,249 A * | 7/2000 | Talbot et al. | 324/754.22 |
| 6,198,095 B1 | 3/2001 | Staib | |
| 6,232,787 B1 * | 5/2001 | Lo et al. | 324/754.22 |
| 6,429,427 B1 * | 8/2002 | Frosien | 250/310 |
| 6,610,980 B2 * | 8/2003 | Veneklasen et al. | 850/8 |
| 7,019,484 B2 * | 3/2006 | Takemori et al. | 318/685 |
| 7,022,986 B2 * | 4/2006 | Shinada et al. | 250/310 |
| 7,109,484 B2 * | 9/2006 | Nakasuji et al. | 250/310 |
| 2002/0028399 A1 | 3/2002 | Nakasuji et al. | |
| 2002/0088940 A1 | 7/2002 | Watanabe et al. | |
| 2002/0148975 A1 | 10/2002 | Kimba et al. | |

FOREIGN PATENT DOCUMENTS

| | | |
|---|---|---|
| JP | 5-109379 | 10/1991 |
| JP | 5-258703 | 5/1992 |
| JP | 7-249393 | 3/1994 |
| JP | 9-270242 | 4/1996 |
| JP | 10-97837 | 9/1996 |
| JP | 9-171793 | 11/1996 |
| JP | 10-197462 | 1/1997 |
| JP | 11-108864 | 10/1997 |
| JP | 2000-340160 | 5/1999 |
| JP | 2001-210264 | 1/2000 |
| JP | 2002-093359 | 9/2000 |

OTHER PUBLICATIONS

W.D. Meisburger, A.D. Brodie and A.A. Desai, "Low-voltage electron-optical system for the high-speed inspection of integrated circuits", J.Vac. Sci. Technol. B10(6), American Vacuum Society, 1992, pp. 2804-2808.

"Mirror Electron Microscopy", Advances in Imaging and Electron Physics, vol. 94. pp. 81-150.

LSI Testing Symposium/1999 Proceedings, p. 142.

Douglas Hendricks, Jack Jau, Hans Dohse, Alan Brodie and Dan Meisburger, "Characterization of a New Automated Electron-Beam Wafer Inspection System", SPIE vol. 2439, pp. 174-183.

A. B. Bok, J.B, Le Poole, J. Roos and H. De Lang, "Mirror Electron Microscopy" in "Advances in Optical and Electron Microscopy", vol. 4, Academic Press 1971, pp. 161-171.

M. Mankos, R.M. Tromp, M.C. Reuter and E. Cartier, "Imaging Hot-Electron Emission from Metal-Oxide-Semiconductor Structures," Physical Review Letters, vol. 76, No. 17, Apr. 22, 1996, pp. 3200-3203.

R.M. Tromp, "Low-energy electron microscopy", IBM J. Res. Develop., vol. 44, No. 4, Jul. 2000, pp. 503-516.

* cited by examiner

SIMULATION RESULTS OF DEFECT IMAGE

RESOLUTION AND EMISSION ANGLE

EMISSION PROBABILITY LESS THAN EMISSION ANGLE $\beta$

APPARATUS AND METHOD FOR WAFER PATTERN INSPECTION

CROSS-REFERENCE TO RELATED APPLICATION

This application is a Continuation of U.S. application Ser. No. 10/196,274 filed Jul. 17, 2002. This application claims priority to U.S. application Ser. No. 10/196,274 filed Jul. 17, 2002, which claims priority to Japanese Patent Application No. 2002-002002 filed on Jan. 9, 2002, the contents of which are hereby incorporated by reference into this application.

BACKGROUND OF THE INVENTION

1. Field of the Invention

The present invention relates to apparatus and methods for inspection of surfaces of samples such as semiconductor devices.

2. Description of the Related Art

In manufacture of semiconductor devices, defects of circuit patterns formed on wafers are detected, for example, by comparison of images. For example, Japanese Patent Application Laid-Open No. 59-192943; J. Vac. Sci. Tech. B, Vol. 9, No. 6, pp. 3005-3009 (1991); J. Vac. Sci. Tech. B, Vol. 10, No. 6, pp. 2804-2808 (1992); SPIE Vol. 24, No. 39, pp. 174-183; and Japanese Patent Application Laid-Open No. 05-258703 disclose methods for pattern inspection by pattern comparison according to "SEM process" using a scanning point electron beam.

These techniques are used for detection of defects each having a small size under the resolution limit of optical microscopes, such as minute etch residues or minute pattern defects and for detection of electric defects such as open defects of fine via-holes and contact holes. These techniques must yield pattern images at a very high speed in order to provide a practical inspection speed. To ensure a satisfactory signal to noise ratio (a S/N ratio) of the images obtained at a high speed, these techniques use a beam electric current higher hundred times or more (10 nA or more) that of conventional scanning electron microscope.

Japanese Patent Application Laid-Open No. 7-249393, No. 10-197462, No. 2000-340160 and No. 11-108864 mention apparatus for high-speed inspection by means of a "projection process" in which a rectangular electron beam is applied to a semiconductor wafer, and images of back scattered electrons, secondary electrons or reflected electrons are formed with lenses. The reflected electrons are reflected without impingement on the wafer due to a formed retarding field for primary beam.

Separately, a technique for obtaining an image of the outermost surface of a sample using a "mirror microscope" has been proposed (e.g., Rheinhold Godehardt, ADVANCES IN IMAGING AND ELECTRON PHYSICS, VOL. 94, p. 81-150). In this technique, a potential is applied to the sample to yield an electric field, and the electric field reflects an electron beam in the vicinity of the surface of the sample without impingement on the sample.

However, all the conventional techniques for inspection using electron beams, such as the SEM process and the projection process using backs scattered electrons or secondary electrons, have the following problems.

The SEM process uses an electron beam current higher than that in conventional scanning electron microscopes in order to form images having a satisfactory signal to noise ratio to be inspected. However, the SEM process cannot inspect a sample with a satisfactorily high speed (for a short time), since it two-shapeally scans the surface of the sample with a "point electron beam" formed by converging an electron beam to a point beam.

In addition, the brightness of an electron source used and space charge effect limit increase in the electron beam current. For example, to yield a resolution of about 0.1 μm, the theoretical limit of the electron beam current is about several hundreds nanoamperes, and at most an electron beam current of about hundred nanoamperes is used in practice. A signal to noise ratio of an image is determined by the product of the time to acquire the image and the number of electrons used for the formation of the image, i.e., the magnitude of the electron beam current. To yield a sufficient signal to noise ratio of an image so as to operate image processing procedure successfully, it takes 100 seconds or longer to inspect an area of 1 $cm^2$ on the surface of the sample when a 100-nA electron beam current 0.1 μm in size is used.

In contrast, the projection process can illuminate the sample with a higher electron beam current at once than the SEM process and can yield images at once. Accordingly, the projection process may form images at a much higher speed than the SEM process. However, in the projection process, the secondary electrons are emitted at angles in a broad range and have energy in a broad distribution ranging from about 1 to 10 eV. To form an image of such electrons to thereby form a magnified image of the sample, the great majority of the second electrons must be cut off to yield a sufficient resolution. This can easily be understood from FIG. 6 in LSI Testing Symposium/1999 Proceedings, p. 142. This figure shows the relationship between the negative voltage applied to the sample to accelerate the secondary electrons emitted from the sample and the resolution in image formation of the secondary electrons and shows that the resolution is about 0.2 μm when the voltage applied to the sample is −5 kV.

All the emitted secondary electrons are not always used for the image formation. For example, the calculation in the reference mentioned above uses a beam having an angle of aperture of less than or equal to 1.1 milliradian (mrad) in an image plane after passing through an objective lens. Secondary electrons each having an angle of aperture within this range occupy at most about 10% of the total secondary electrons. In the calculation, the energy distribution of the secondary electrons for use in image formation is assumed at 1 eV. However, secondary electrons actually emitted have a distribution range of energy of equal to or more than several electron volts or more, and some of them have energy of about 50 electron volts. Such secondary electrons having an energy distribution of at most 1 eV constitute only a fraction of secondary electrons having a broad energy distribution as described above.

As thus described, when a high-current electron beam as a sheet beam is applied to form images at once, a sufficient signal to noise ratio of the image cannot significantly be obtained and the inspection time cannot sufficiently be shortened to an expected extent, since the ratio of electrons actually contributing to image formation is low. Likewise, in the projection process using back scattered electrons, electrons are emitted in an amount less by two orders of magnitude than the primary electron beam. Accordingly, the projection process using back scattered electrons cannot yield a high resolution and high speed in inspection concurrently as in the projection process using secondary electrons.

In addition, this technique does not limit the direction of trajectory of the electron beam directed to the sample, illuminates the sample with the electron beam with a broad range of angles and thereby yields insufficient resolution of about submicron order and is insufficient in resolution to inspect current downsized semiconductor devices.

SUMMARY OF THE INVENTION

Accordingly, an object of the present invention is to provide a method and apparatus for wafer pattern inspection for detecting defects of patterns formed on wafers with high resolution at a high speed.

The above and other objects of the present invention can be achieved by the following configurations.

Specifically, an electron beam not as a point beam but as a sheet beam (a two-shapeal electron beam) spreading two-shapeally is sequentially applied to plural illumination area (area fields) on a surface of a sample wafer. A negative potential is applied to the sample wafer. The negative potential is set at such a potential as to repel the great majority of electron beam in the vicinity of the outermost surface of the wafer and is, for example, a negative potential 0.5 to 5 V greater than that of an electron source (cathode). Then an image of the repelled electrons is formed. Hereinafter, such electrons which are repelled and turn back without impingement on the sample by action of an electric field are referred to as "drawn-back electrons" or "mirror electrons". Magnified images of the respective plural illumination area are formed sequentially, are converted into electric image signals and are compared with one another. This configuration can detect pattern defects in the respective illumination area with high resolution at a high speed.

Specifically, the present invention provides, in an aspect, a method for wafer pattern inspection. The method includes the steps of sequentially illuminating plural illumination area on a surface of a sample with a sheet electron beam, a negative voltage with reference to the potential of an electrode facing the surface of the sample being applied to the sample, the sheet electron beam two-dimensionally spreading in its plane profile upon application to the surface of the sample; forming an image of electrons constituting the electron beam upon an imaging device, the electrons not impinging with the surface of the sample but turning back in the vicinity of the surface of the sample; converting plural electron images corresponding to the plural illumination area to plural electron image signals, respectively, using the imaging device; and comparing the plural image signals with one another to thereby detect a pattern defect formed in the sample. In the method, the sheet electron beam is preferably applied to each of the plural illumination area in such a manner that the electrons constituting the sheet electron beam are approximately in parallel with one another in their traveling directions and are applied approximately vertically to the surface of the sample.

In another aspect the present invention provides an apparatus for wafer pattern inspection. The apparatus includes a first electron optical system for sequentially illuminating plural illumination area on a surface of a sample with a sheet electron beam, the sheet electron beam being generated from an electron source and two-shapeally spreading in its plane profile upon application to the surface of the sample; a device for generating an electric field capable of repelling electrons constituting the electron beam in the vicinity of the outermost surface of the sample; a second electron optical system for forming images of electrons constituting the electron beam to thereby form magnified images of the plural illumination area, which electrons are repelled and turn back from the plural illumination area; an image signal detection device for converting plural magnified images corresponding to the plural illumination area to plural electric image signals, respectively; and an image signal processing device for comparing the plural image signals on the plural illumination area with one another to thereby detect a pattern defect formed in the sample.

The present invention also relates to an apparatus for wafer pattern inspection. This apparatus includes an electron beam illumination system for illuminating plural illumination area on a surface of a sample with a sheet electron beam, the sheet electron beam being generated from an electron source and two-shapeally spreading in its plane profile upon application to the surface of the sample; a device for generating an electric field capable of repelling part or all of the electrons constituting the sheet electron beam in the vicinity of the surface of the sample without impingement on the surface of the sample; an imaging optical system for forming images of electrons constituting the electron beam which are repelled and turn back from the vicinity of the surface of the sample to thereby form magnified images of the plural illumination area; a sample stage for bearing and moving the sample so as to illuminate each of the plural illumination areas with the electron beam; an image signal detection device for converting plural electron images corresponding to the plural illumination area into plural electric image signals, respectively; and an image signal processing device for comparing the plural image signals with one another and for detecting the presence of a difference exceeding a predetermined threshold to thereby detect a pattern defect in each illumination field.

The apparatus for wafer pattern inspection of the present invention may further comprise an electron optical system for obtaining a scanning electron microscopic image of the sample at a predetermined position in the moving direction of the sample stage.

The first electron optical system or the electron beam illumination optical system may include an electron gun for generating the electron beam; a condenser lens for converging the electron beam emitted from the electron gun; and an objective lens arranged between the condenser lens and the sample, in which the condenser lens serves to position the focus of the electron beam in the vicinity of a focal plane of the objective lens on the electron source side, and the sheet electron beam may be applied to each of the plural illumination areas in such a manner that the electrons constituting the sheet electron beam are approximately in parallel with one another in their traveling directions and are applied approximately vertically to the surface of the sample.

When an aperture electrode facing the sample plays a significant role as an electron lens, the focus of the electron beam may be positioned upon the focal plane of such an aperture lens by means of the objective lens. This configuration can yield a sheet electron beam, electrons constituting the sheet electron beam travel approximately in parallel and in a direction approximately perpendicular to the surface of the sample.

The device for generating an electric field in the vicinity of the surface of the sample may be composed of a power supply for applying a predetermined negative potential to, for example, a conductive sample holder for holding the sample. When the sample is, for example, a semiconductor having an insulating film on its surface, the apparatus may further comprise a second electron gun and a pre-charge control system. The second electron gun is arranged at a distance from the optical axis of the electron beam for image formation, and the pre-charge control system applies electrons to the sample prior to image formation. The apparatus may further include a grid for applying a potential between the sample and the second electron gun, and a device for applying electrons to the sample using the second electron gun while controlling the potential applied to the grid.

To inspect open defect of via-hole and contact hole, such as electrical shortings or break, of a pattern of a semiconductor sample, a potential difference between a normal pattern and a defective pattern formed by the preliminary illumination is detected to thereby detect a faulty pattern. However, when the defective pattern has a relatively low resistance, an accumulated charge escapes into the surroundings, and the potential difference between the normal pattern and defective pattern formed by the preliminary illumination cannot be maintained for a long time. In this case, the apparatus must further include a device for injecting electrons into the sample to thereby generate a potential difference between the normal pattern and the defective pattern and a device for applying electrons that do not impinge on the sample and form an image at approximately the same position approximately concurrently. To charge a faulty pattern and an insulating film pattern negatively, an electron beam having energy higher by eVn than the potential of the sample is applied to the sample, and an image is formed under a condition in which an insulator is charged at a negative potential of Vn and is stabilized. By this procedure, images can be obtained while the faulty pattern and the insulating film pattern are negatively charged. To charge the faulty pattern and the insulating film pattern positively, a beam for image acquisition and an electron beam or light ray for charging the sample positively may be applied at the same time or alternately.

By setting the sample stage so as to move the sample continuously at an approximately constant speed, the defect can be inspected at a higher speed. In this configuration, the position of the sample stage must be monitored to control the electron beam to be applied to each illumination field on the sample surface for a predetermined time period. Specifically, the apparatus may preferably further include a stage-position measuring mechanism for real-time measurement of the position of the sample stage capable of continuously moving, in which the stage-position measuring mechanism determines a change in position with the continuous moving of the sample stage to feed back the measurement in position to an electron beam deflection mechanism of the first electron optical system to thereby ensure that the relative position between the electron beam and the sample moves in a predetermined direction at an approximately constant speed.

The image signal detection device may project a magnified electron image formed by the second electron optical system or the imaging optical system on a phosphor screen to convert the same into an optical image and may form project the optical image onto an optical image detection device via an optical lens or an optical fiber. Alternatively, the magnified electron image formed by the optical system may be projected directly on an image detection element having sensitivity for electron. As the image detection element, a charge coupled device (CCD) or a device for integrating an optical signal input in a time delayed manner and outputting the integrated signal (time delayed integration sensor: TDI sensor). Detection signals from the image detection element may be read out by multiple channels in parallel.

In addition and advantageously, the present invention provides an apparatus for wafer pattern inspection. The apparatus includes a first device for launching a sheet light ray with a desired incident energy into a sample, the sheet light ray being generated from a light source and two-dimensionally spreading in its plane profile upon application to the surface of the sample; a second device for applying a sheet electron beam in such a manner that the sheet electron beam is decelerated in the vicinity of the surface of the sample so that at least part of electrons constituting the electron beam are repelled and turn back from the vicinity of the surface of the sample without impingement on the surface of the sample; an electron optical system for forming an image of electrons constituting the electron beam upon an imaging device arranged on an extension of trajectories of the electrons, the electrons not coming into impingement on the surface of the sample but turning back from the vicinity of the surface of the sample; an image signal detection device for converting plural electron images corresponding to the plural illumination area to plural electric image signals, respectively, using the imaging device; and an image signal processing device for comparing the plural image signals with one another to thereby detect a defect formed in the sample.

The present invention can thereby provide methods and apparatus for wafer pattern inspection which can image and detect fine pattern defects and electric defects such as open defects, shortings, and leakage on the surface of a sample such as a semiconductor device with a high sensitivity and high resolution at a high speed by using electron beams.

DESCRIPTION OF THE PREFERRED EMBODIMENTS

The present invention will be illustrated in further detail with reference to several embodiments and attached drawings.

First Embodiment

Figure 1:
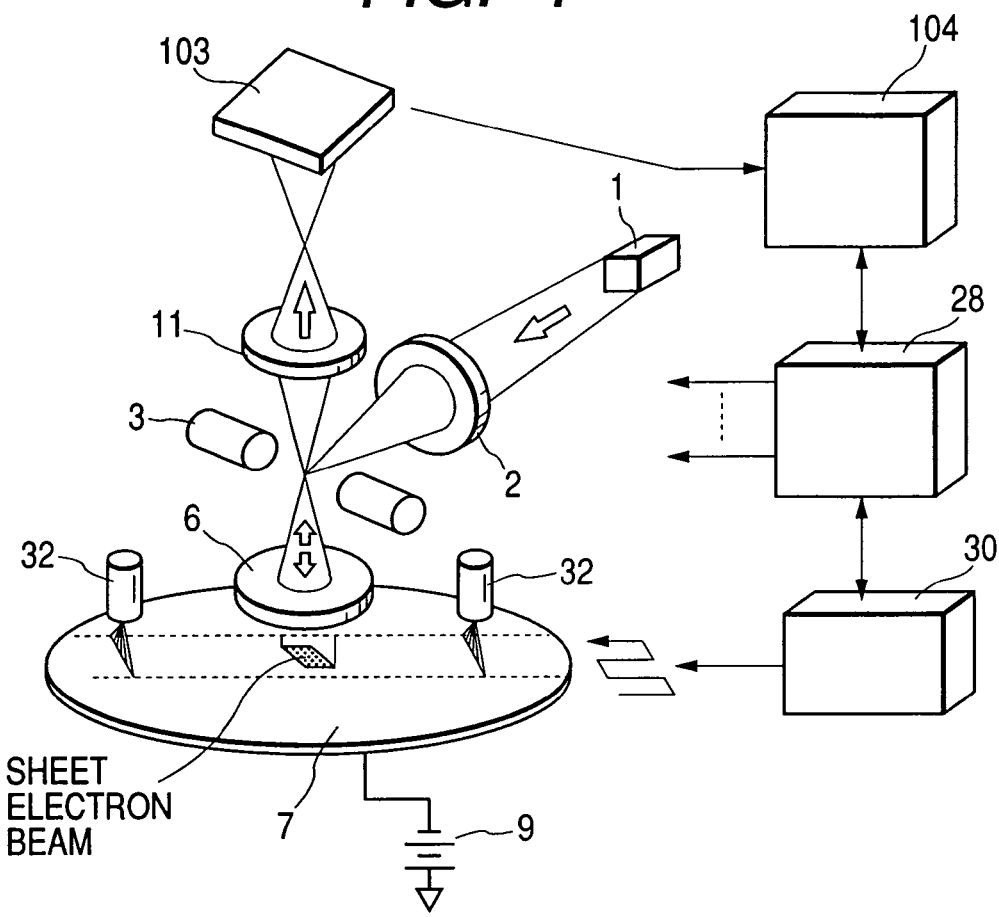
FIG. 1 is a diagram schematically illustrating a configuration of an inspection apparatus according to the present invention.

FIG. 1 illustrates minimal essential components for the explanation of the operation principle of the present invention. An electron beam emitted from an electron source 1 is converged by a condenser lens 2 to form a crossover in the vicinity of a beam separator 3 in a front focal plane of an objective lens 6. The beam separator 3 deflects the electron beam to have an optical axis perpendicular to a wafer 7. The beam separator 3 only serves to deflect an electron beam incident from above. As the beam separator 3, an E×B deflector carrying an electric field and a magnetic field perpendicular to each other can be used, for example. The objective lens 6 converts the electron beam deflected by the beam separator 3 into a sheet electron beam uniform in a direction perpendicular to the surface of the sample (wafer) 7.

A negative potential approximately equal to or slightly higher than an accelerating voltage of the electron beam is applied to the sample (wafer) 7 by a power supply 9 to thereby yield an electric field. The electric field corresponds to the shape of a semiconductor pattern formed or the charge thereof on a surface of the wafer 7. The great majority of the sheet electron beam is repelled by action of the electric field immediately before impingement on the wafer 7 and comes back upward with a direction and intensity corresponding to the pattern information of the wafer 7.

The repelled electron beam is converged by the objective lens 6 and rises vertically, since the beam separator 3 does not deflect an electron beam coming from beneath. The electron beam then passes through an imaging lens to thereby form an image of the surface of the wafer 7 on an image detection unit 103. By this procedure, an image reflecting a change in local charge potential or a difference of the structure, such as projections and depressions, on the surface of the wafer 7 is formed. The image is converted into an electric signal and is transmitted to an image processing unit 104.

To detect a defect of a semiconductor pattern formed on the wafer 7, the image processing unit 104 compares the obtained image with an image of an another part having the same pattern or compares the obtained image with an image of a defect-free portion obtained previously and stores a different portion as a defect in memory. The wafer 7 is placed on a stage (not shown), and the stage is continuously moved by a stage control system 30. The stage control system 30 and a beam control system 28 are linked to each other and continuously move an image acquisition filed while finely adjusting the position of the electron beam with the movement of the stage by action of a deflector (not shown).

When the wafer 7 carries an insulator on its surface, the power supply 9 alone cannot determine the surface potential of the wafer 7. Accordingly, the apparatus further comprises a pre-charge control system 32 for charging the surface of the wafer to a desired potential. This device applies a voltage to a grid electrode in the proximity of the surface of the wafer 7 and applies the electron beam to the wafer 7 to thereby control the potential of the surface of the wafer 7. The operation principle and configuration of the pre-charge control system will be illustrated later. To charge the surface of the wafer 7 prior to inspection, the wafer 7 is passed underneath the pre-charge control system 32 to thereby charge inspection fields to a desired potential and is then passed directly below the objective lens 6 to form an image.

An image of a defect of the wafer surface is formed under such conditions that the electron beam is repelled from the surface of the wafer 7 based on the following principle.

Figure 2:
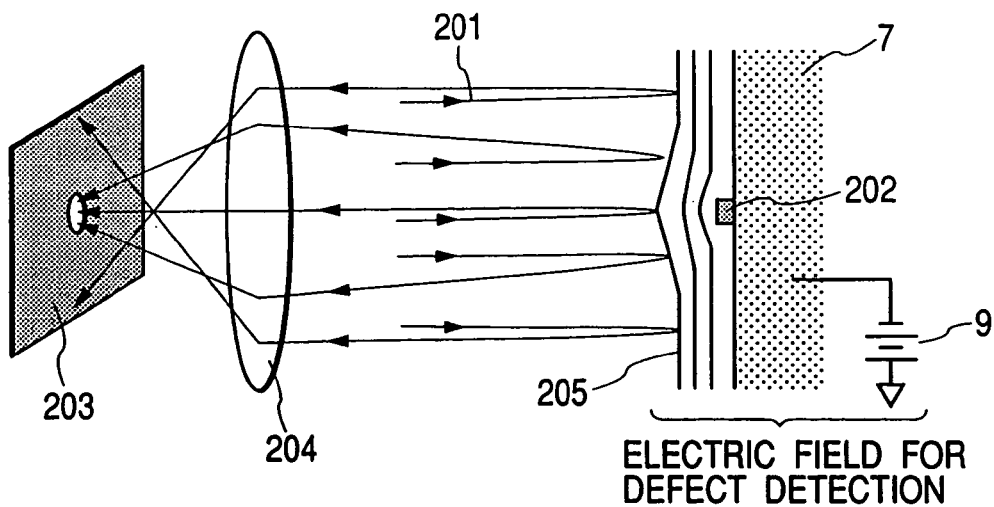
FIGS. 2 and 3 are diagrams illustrating the principle of the present invention, respectively.

FIG. 2 schematically illustrates an electron beams 201 which vertically enters an equipotential line 205 in the vicinity of the outermost surface of the wafer 7 and are repelled and turn back. The equipotential line 205 exhibits a nonuniform shape in a portion carrying a defect 202 on the surface of the wafer 7. The electron beam vertically entered there does not vertically turn back due to the nonuniform shape but turns back at an angle shown in the figure and enters a lens 204. The lens 204 is illustrated as one lens yielding an equivalent operation to those of the objective lens 6 and an imaging lens 11. When an image is formed on an imaging plane 203 by action of the lens 204, the electrons from the portion carrying the defect 202 are concentrated at a point of the imaging plane, and the point becomes brighter than the surroundings, as shown in FIG. 2. The image can serve to detect the presence and the location of the defect.

Figure 3:
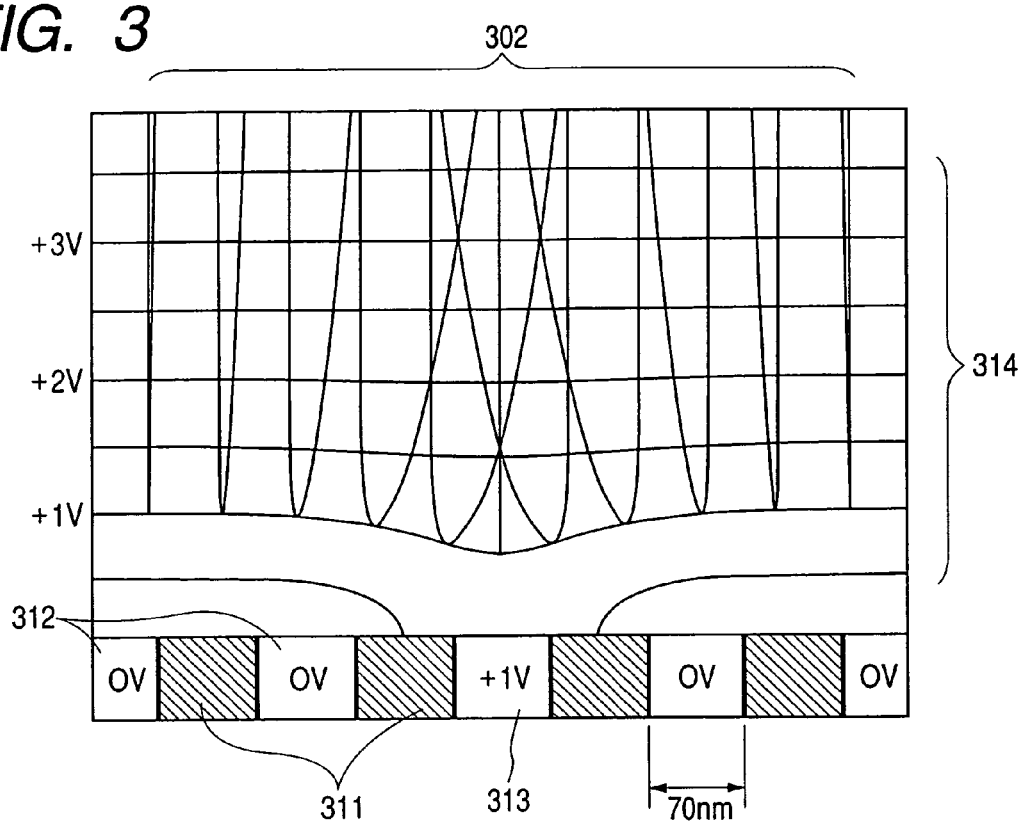

FIG. 3 shows the result of a simulation of an equipotential line 314 in the vicinity of the surface of the wafer and a trajectory 302 of the electron beam according to the present invention. The cross section of a pattern includes conductive materials 312 (open squares) and insulating films 311 (diagonally shaded areas) each 70 nm in size. It is assumed in this procedure that a central conductive material 313 has a potential of 1 V and the other conductive materials 312 each have a potential of 0 V. In other words, it is assumed that the central conductive material 313 alone has insufficient conduction with a substrate and is thereby positively charged at a potential of 1 V with respect to the surroundings.

The potential of the electron source is set at one electron volt (eV) higher than the potential of the wafer. Specifically, when the potential applied to the wafer is 0 V, the electron beam is reflected on an equipotential surface of +1 eV to form an imaging electron beam. FIG. 3 shows that a central pattern having a different potential disturbs equipotential lines, the disturbed equipotential lines strongly affect the electron beams, and the vertically incident electron beams are reflected at large angles.

Figure 4:
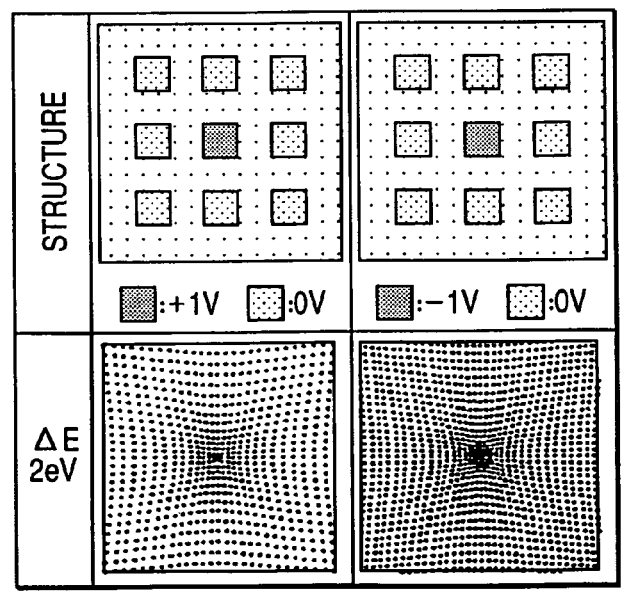
FIG. 4 is a diagram showing an example of an image of a defect obtained according to the present invention.

FIG. 4 shows simulation results of the density of electron beams repelled by the electric field and turned back from the surface of the wafer. As shown in "Structure" in the figure, arrayed squares in three rows and three columns represent conductive substances. It is assumed that a conductive substance at the center alone has a potential different from the surroundings by one volt. The trajectory of the electron beam in this case is calculated provided that the electron beam has an energy width (ΔE) of 2 eV, and the lower portions of FIG. 4 are plots of electrons turned back from the surface of the wafer. A highly dotted portion means a high electron density. The figure shows that the electrons are concentrated at the center to form a portion exhibiting a high electron density, indicating that a change of 1 V in the 70-nm fine pattern can be detected according to the principle shown in FIG. 2. In other words, an open defect of via-hole and contact hole can be detected according to the principle.

One of the advantages of the present invention will be described in detail below. Specifically, the present invention can markedly improve an inspection speed as compared with the process of scanning a point electron beam (SEM process) or the process of projecting secondary electrons. In imaging devices using electron beams, the speed of image acquisition is ultimately limited and determined by a signal to noise ratio required for the image. The signal to noise ratio of the image is determined by the number of electrons used in formation of the image. The required signal to noise ratio is determined by the magnitude of image contrast caused by a defect to be detected. Specifically, when the contrast of the defect is defined as a signal C, the noise must be lower than the signal C. The noise N is defined by three sigmas (3σ) of the signal. The standard deviation sigma σ is determined by the shot noise of the number of applied electrons and is the square root ($\sqrt{S}$) of the number S of electrons applied per pixel. Accordingly, the noise N is defined as $3\sqrt{S}$.

When the electron beam is brought into impingement on the wafer 7 to thereby detect secondary electrons formed as in the conventional technique, the process further includes a stochastic process of secondary electron emission from the sample. Accordingly, when the secondary electron emission is assumed to be a Poisson process, the noise N is expressed as $(3\sqrt{2})\sqrt{S}$. When the defect contrast C is assumed at 5% of the average signal amount S, the defect contrast C equals 0.05 S, the noise N must be less than or equal to 0.05 S and the average signal amount S must be equal to or more than 7200. The inspection time T per square centimeter can be calculated according to the following equation based on this concept.

$$T = (0.01/x)^2 \cdot t \qquad (1)$$
$$= \left(1.6e\text{-}19 \cdot 0.01^2 \cdot (3\sqrt{2})^2\right) \Big/ (I \cdot \eta \cdot C^2 \cdot Pix^2)$$

wherein $t=((1.6e\text{-}19\cdot(3\sqrt{2})^2)/(I\cdot\eta\cdot q\cdot C^2))\cdot(x^2/Pix^2)$ In the equation (1), t is the time within which the electron beam must reside at the same place in order to lower the noise than the contrast C. Specifically, the time t is the time for an electron beam probe to illuminate one pixel in the SEM process. The time t is the time for a beam to be directed to one point in the sheet beam illumination process. The time t is referred to as "shot time" hereinafter.

In the equation (1), Pix is the required resolution; x is the length of one side of the sheet beam (it is the same with the pixel size, i.e. Pix, in the SEM process); I is the beam current; and η is the detect efficiency of electrons that can be used for image formation. In contrast, the process according to the present invention does not include a stochastic process caused by secondary electron emission, since the electron beam is repelled by the electric field without impingement on the surface of the wafer 7. Accordingly, "$\sqrt{2}$" in the equation (1) can be omitted in this process, and the inspection time T can be expressed according to the following equation (2):

$$T = (0.01/x)^2 \cdot t \qquad (2)$$
$$= (1.6e\text{-}19 \cdot 0.01^2 \cdot (3)^2)/(I\cdot\eta\cdot C^2 \cdot Pix^2)$$

wherein $t=((1.6e\text{-}19\text{-}(3)^2)/(I\cdot\eta\cdot C^2))\cdot(x^2/Pix^2)$ The parameters η and C in the aforementioned processes will be estimated below. According to the SEM process, secondary electrons are emitted in an approximately equal number to the primer electrons constituting the irradiated electron beam, almost all of the emitted secondary electrons can be detected by a detector, and thereby η is approximately 1.

According to the secondary electron projection process, a sheet electron beam is applied to the wafer 7 and images of generated secondary electrons are formed. In this process, only a limited number of emitted secondary electrons must contribute to image formation. If not, the resolution is deteriorated. This mechanism will be described in detail below with reference to FIGS. 5 and 6.

Figure 5:
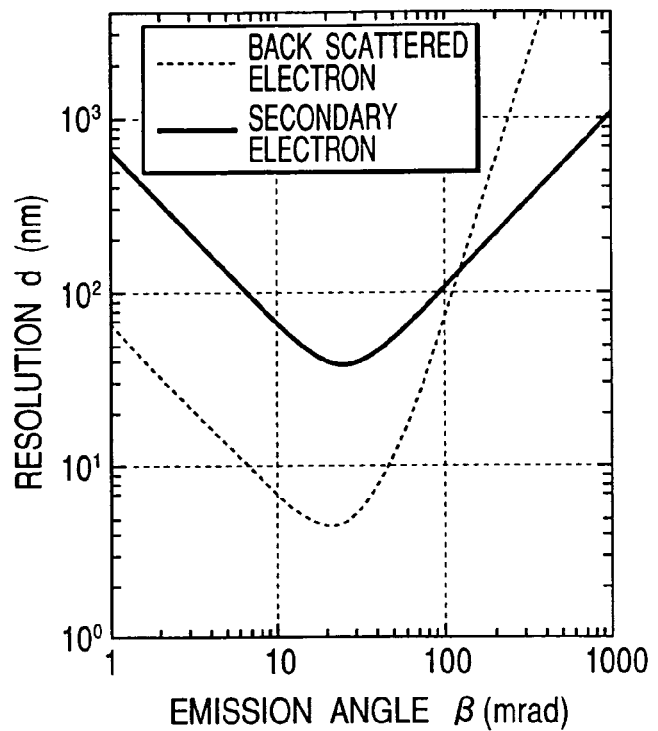
FIGS. 5 and 6 are diagrams showing the efficiency of electron utilization in image formation according to conventional technologies.

FIG. 5 shows the relationship between the emission angle β of secondary electrons or back scattered electrons contributing image formation and the resolution of the image. The emission angle β corresponds to the aperture angle of electrons captured in the imaging system. The figure shows that, when an image is formed using secondary electrons having an emission angle of less than or equal to 100 mrad, the resolution is about 100 nm, for example. The calculation is performed on the condition that the electrons applied to the wafer have energy of 500 eV, the wafer surface is in a strong electric field of 5 kV/mm, and the secondary electrons have an energy width of 5 eV. Such secondary electrons have a broad energy distribution of equal to or more than 10 eV, but secondary electrons having an energy in a range of 2±2.5 eV alone are used in image formation. These secondary electrons occupy about a half of the total secondary electrons.

Figure 6:
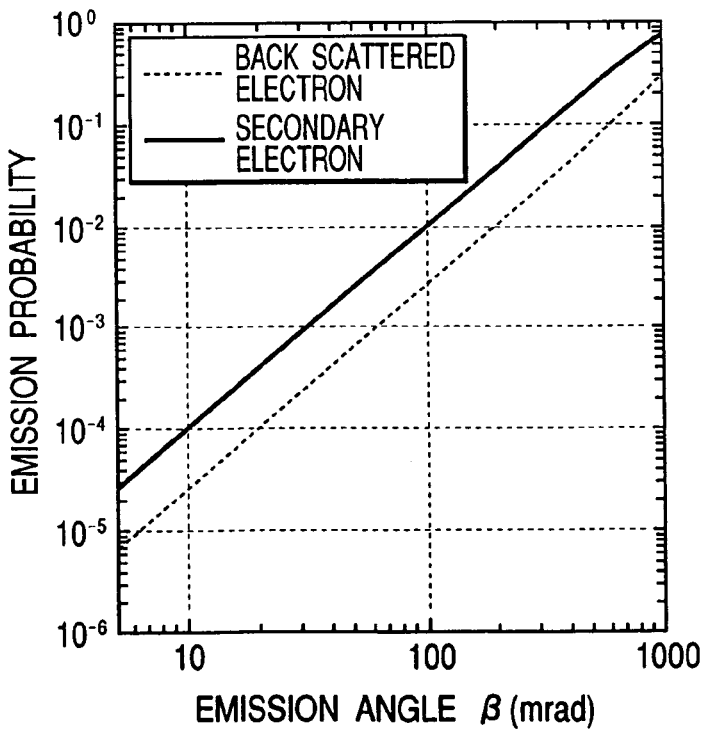

As back scattered electrons, elastically scattered electrons alone are took into account, and these electrons are assumed to have an energy width of 1 eV. FIGS. 5 and 6 show that the secondary electrons must have an emission angle of 25 mrad to yield a resolution of 40 nm, for example and that the probability of scattering of the secondary electrons within the emission angle β of 25 mrad is about 0.1%. Assuming that the yield of the secondary electrons (the ratio of the number of the secondary electrons to the number of the primary electrons) is about 1, the parameter η in the secondary electron projection process is ½×0.001×1=0.0005.

In the projection process using back scattered electrons, the emission angle β must be 80 mrad in order to yield a resolution of 40 nm, and the probability of occurrence of the back scattered electrons within the emission angle of 80 mrad is 0.2%, as shown in FIG. 6. The yield of the back scattered electrons (the ratio of the number of the back scattered electrons to the number of primary electrons) is about 0.02 to 0.03 at an illumination energy of 500 eV (refer to Image Formation in Low-Voltage Scanning Electron Microscopy, SPIE, Bellingham, p. 43, p 67, 1993). Accordingly, the parameter η in the back scattered electron projection process is as low as $0.002 \times 0.025 = e^{-5}$.

Figure 7:
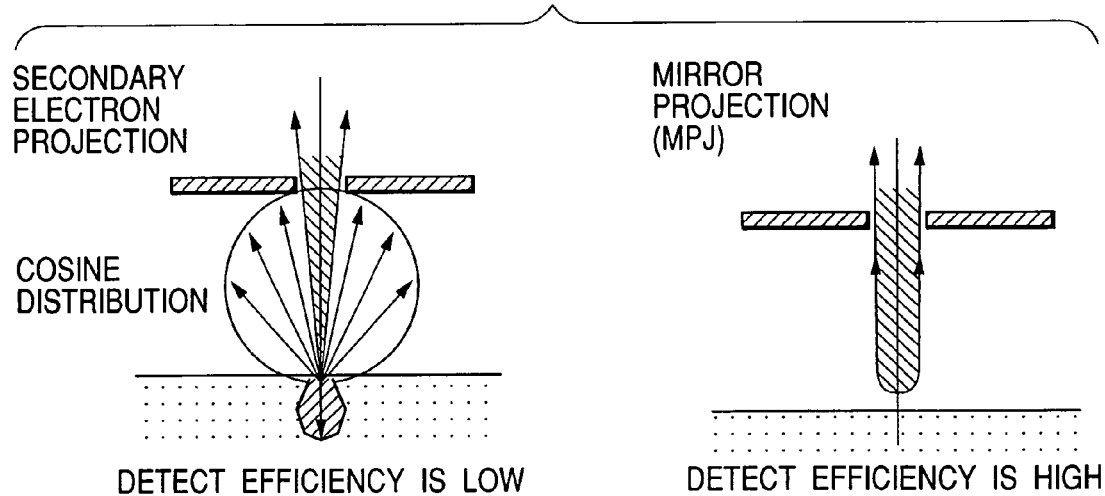
FIG. 7 is a diagram showing the difference in efficiency of electron utilization in image formation between the present invention and the conventional technologies.

In contrast, according to the present invention, the electron beam is repelled and turns back vertically upward on a flat wafer surface, and the aperture angle of the beam is equivalent to angle variation of the irradiated electron beam and is very low of about several milliradians. FIG. 7 is an explanatory diagram for further deepening the understanding of the above description.

According to the secondary electron projection process, the secondary electrons are emitted into a vacuo and spread at an angle of 180 degrees from the sample as shown in the left hand of FIG. 7. In contrast, according to the present invention (mirror projection process), all the applied electrons move approximately right upward, and the applied electrons can effectively be utilized in image formation, as shown in the right hand of FIG. 7. When the surface of the wafer carries a protrusion or depression or a potential distribution, the electrons move upward at some angles from the vertical. In this case, the ratio of electrons directly contributing image formation decreases, but the change in angle itself contributes to the formation of image of the wafer surface to thereby increase the contrast. In other words, a decrease in η is equivalent to an increase in the contrast C and advantageously serves to detect the defect.

The parameters η and C are linked to each other in the present invention, and C increases with a decreasing η. While depending on the types of the pattern and of the defect to be detected, it is assumed that a half of the total electrons can be detected as images in a defective portion, and the remained half contribute to increase the contrast. Accordingly, η and C are assumed as 0.5, respectively.

Figure 8:
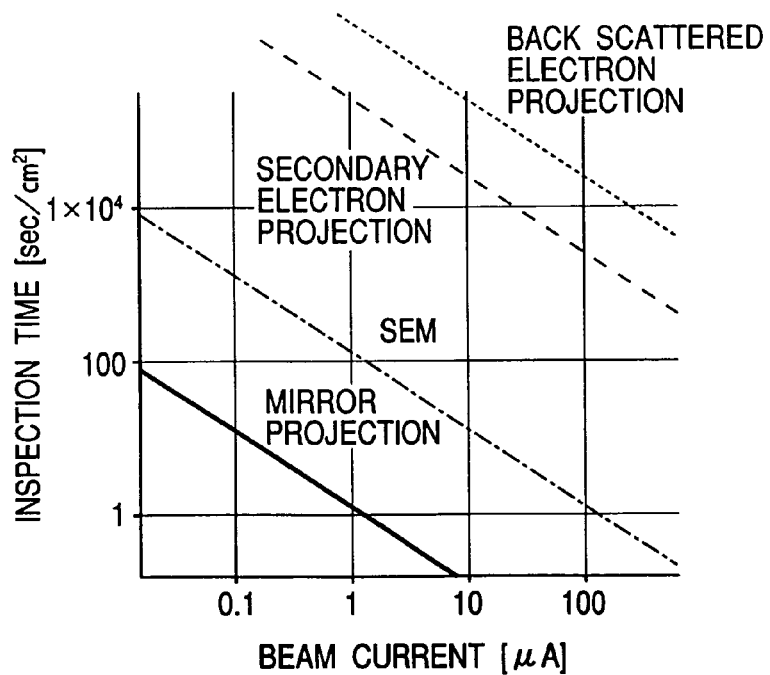
FIG. 8 is a diagram comparing inspection times between the present invention and the conventional technologies.

Table 1 shows the summary of the above description, and FIG. 8 shows the relationship between the beam current and the inspection time. The relationship is estimated provided that Pix is 40 nm. Table 1 and FIG. 8 show that the process according to the present invention can inspect the sample in a significantly short time as compared with the conventional processes.

TABLE 1

|  | Detect efficiency η | Contrast C |
|---|---|---|
| SEM | 1.0 | 5% |
| Secondary electron projection | 5e−4 | 5% |
| Back scattered electron projection | 5e−5 | 5% |
| Mirror projection | 0.5 | 50% |

Figure 9:
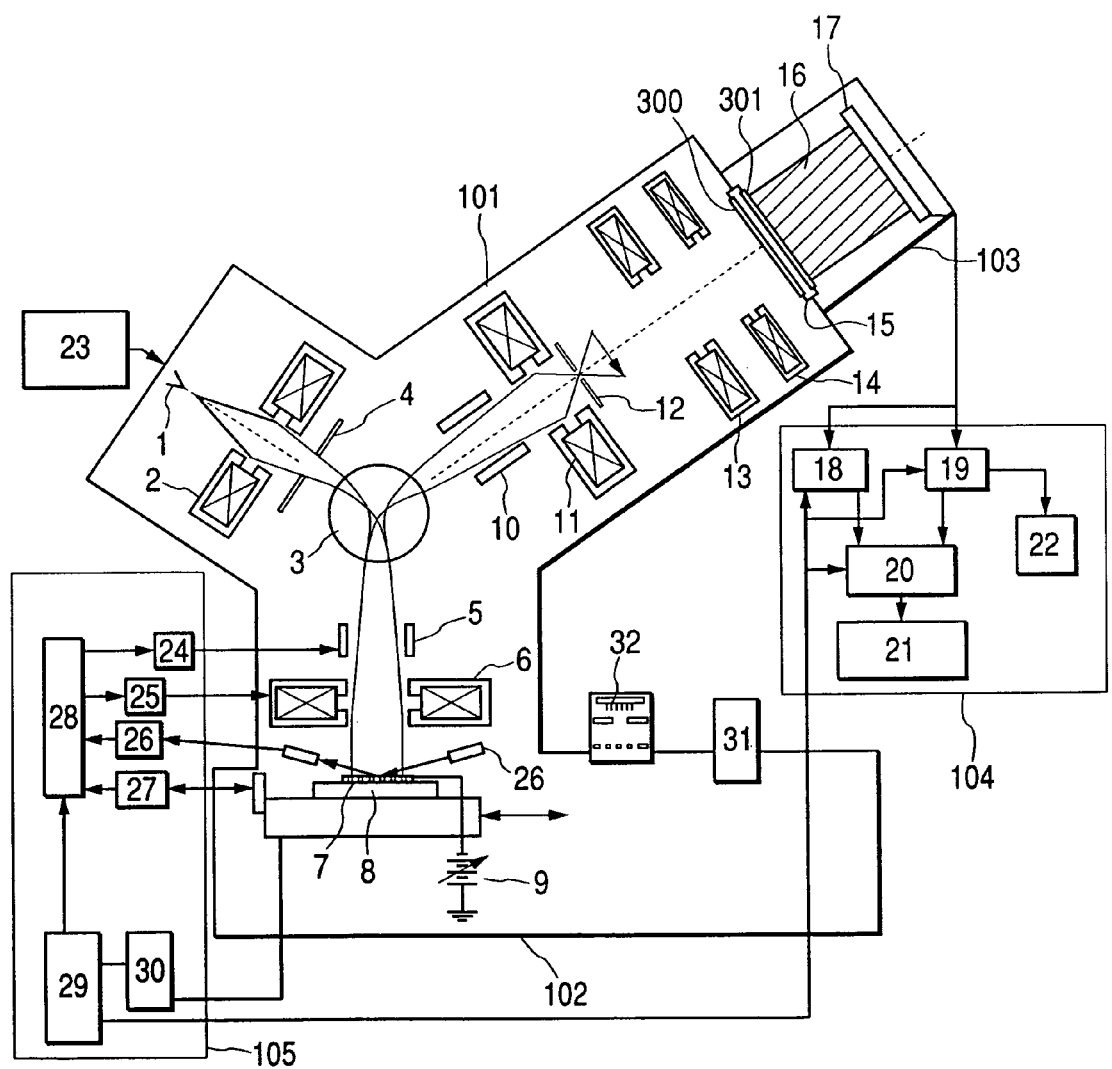
FIG. 9 is a diagram illustrating the configuration according to First Embodiment of the present invention.

The configuration of an embodiment of the present invention will be illustrated in detail below. FIG. 9 illustrates the configuration of an inspection apparatus according to an embodiment of the present invention. The inspection apparatus according to the present embodiment roughly includes an electron optical system 101, a sample chamber 102, an image detection unit 103, an image processing unit 104 and a control unit 105. Each of these units will be described in detail below.

Initially, the electron optical system 101 will be illustrated in detail. An accelerating power supply (electron-source power supply) 23 applies a high negative potential to an electron source 1. The electron source 1 emits an accelerated electron beam, the accelerated electron beam is converged by a condenser lens 2 and is applied to an aperture 4 having a rectangular opening. As the electron source 1, a Zr/O/W Schottky emitter that can stably yield a uniform sheet electron beam at a high current (e.g., 1.5 μA) having an energy width of 1.5 eV is used. A beam separator 3 deflects the electron beam to a direction of the wafer 7. The beam separator 3 serves to separate the optical paths of the incident electron beam from the electron source 1 and of the mirror electron beam from the sample. The condenser lens 2 forms a crossover on a focal plane of the objective lens 6. The aperture and the array of lenses are optimized so as to form an image of the aperture 4 on the surface of the wafer 7 by means of the objective lens 6.

This configuration yields a sheet electron beam in a direction perpendicular to the surface of the wafer 7. The sheet electron beam has a shape analogous to that of the opening of the aperture 4. The electron beam comprises electrons having trajectories arrayed approximately in parallel with one another. The rectangular opening of the aperture 4 is, for example, of 100 μm square. The objective lens 6 reduces the electron beam to the half to thereby yield a sheet electron beam 50 μm square on the surface of the wafer 7. The sheet electron beam can be moved (or scanned) to a desired position on the surface of the wafer 7 by action of an illumination system deflector 5.

If the front focal plane of the objective lens 6 does not completely agree with the crossover position, there is no problem as long as a shift between them is within a tolerance. The crossover ideally has a size of zero but has some limited size in actual due to aberration of the electron gun or condenser lens. Such a crossover having a size within a tolerance is acceptable. In an electron optical system in which the position of the crossover is accurately controlled and the aberration of the electron gun and the condenser lens is sufficiently minimized, the incident angle of the electron beam into the sample can have a minimized divergence of less than or equal to 0.5 mrad. The divergence of the incident angle is one of the factors that determine the resolution of a magnified image on the sample surface formed by the mirror electrons and is expressed by the following equation:

$$r0 = \beta 2 \cdot Zm \quad (3)$$

wherein r0 is the resolution determined by the divergence of the incident angle; β is the maximum incident half angle; and Zm is the distance at which an electron field that repels the electrons is formed.

In the present embodiment, β is 0.25 mrad and Zm is 5 mm. When these parameters are substituted into the equation (3), r0 is 0.3 nm, indicating that the divergence of the incident angle does not affect the resolution in the present embodiment. Accordingly, the beam current can be increased according to necessity.

It is speculated that a defect of a semiconductor can satisfactorily be detected even when the resolution is around 30 nm. Based on this, when Zm is set at 5 mm, β up to 2.4 mrad can be accepted. In this case, the displacement between the front focal plane of the objective lens and the crossover, and the size of the crossover have significant allowances.

The displacement of the crossover Δf can be expressed by the following equations:

$$\Delta f = f \cdot \beta / \alpha \quad (4)$$

$$\alpha = X/(2f) \quad (5)$$

wherein α is the aperture half angle of the beam on the front focal plane; f is the focal distance of the objective lens; Δf is the displacement of the crossover; and X is the radius of the sheet electron beam.

The equations (4) and (5) indicate that the crossover displacement Δf up to about 10 mm can be accepted when the focal distance f of the objective lens is set at 10 mm and the size of the sheet electron beam X is set at 40 μm. The crossover displacement Δf of 10 mm is converted into a beam diameter on the front focal plane of about 40 μm. In all cases, a sufficient resolution can be obtained by positioning the crossover of the electron beam in the vicinity of the front focal plane of the objective lens.

The beam separator 3 will be described in brief. The beam separator 3 deflects the electron beam emitted from the electron source 1 to a direction of the wafer 7 and deflects the mirror electron turned back from the wafer 7 not to a direction of the electron source 1 but to a direction of the imaging lens 11. A deflector utilizing a magnetic field can optimally be used as the deflector herein, since the direction of deflection by a magnetic field varies depending on the incident direction of electrons.

In an optical system comprising the imaging lens and the objective lens 6 having optical axes in line with each other, an E×B deflector is used. The E×B deflector uses an electric field and a magnetic field orthogonal to each other, allows the mirror electron from beneath to travel in a straight line and deflects the electron beam incident from above alone. This embodiment will be illustrated later in detail as Second Embodiment with reference to FIG. 15.

The power supply 9 applies a negative potential to the wafer 7 and the sample stage 8. The negative potential is slightly greater (has a slightly greater absolute value) than that of the electron source 1 and is preferably greater than that of the electron source 1 by 0.5 to 5 V. An excessively greater negative potential may deteriorate the resolution of the image. In contrast, an excessively small negative potential serves to form an image of trivial projections and depressions or a trivial change in potential with an excessively high contrast. In this case, a target defect cannot be detected.

The negative potential decelerates the electron beam in front of the wafer 7, which electron beam is directed in a direction perpendicular to the surface of the wafer 7. The electron beam is drawn back upward by the electric field on the surface of the wafer 7. The repelled electron (mirror electron) carries the information on the surface of the wafer 7, as described above. The objective lens 6 makes a focus of the mirror electron, and the beam separator 3 deflects the mirror electron to a direction of an imaging system deflector 10 and the imaging lens 11. The deflected mirror electron enters the imaging lens 11 to form an image of the state of the surface of the wafer 7 as an electron image. The electron image is magnified and projected on a phosphor screen 15 by magnifying lenses 13 and 14 to thereby yield a fluorescent image (mirror electron image) reflecting the pattern or charge state of the surface of the wafer 7.

To improve the contrast and resolution of the electron image, the apparatus can further comprise a contrast aperture 12 inserted into the crossover plane. The contrast aperture 12 removes electrons that are significantly outside the vertical direction after they are repelled by the electric field on the surface of the wafer 7 to thereby improve the resolution and contrast of the image.

Figure 10:
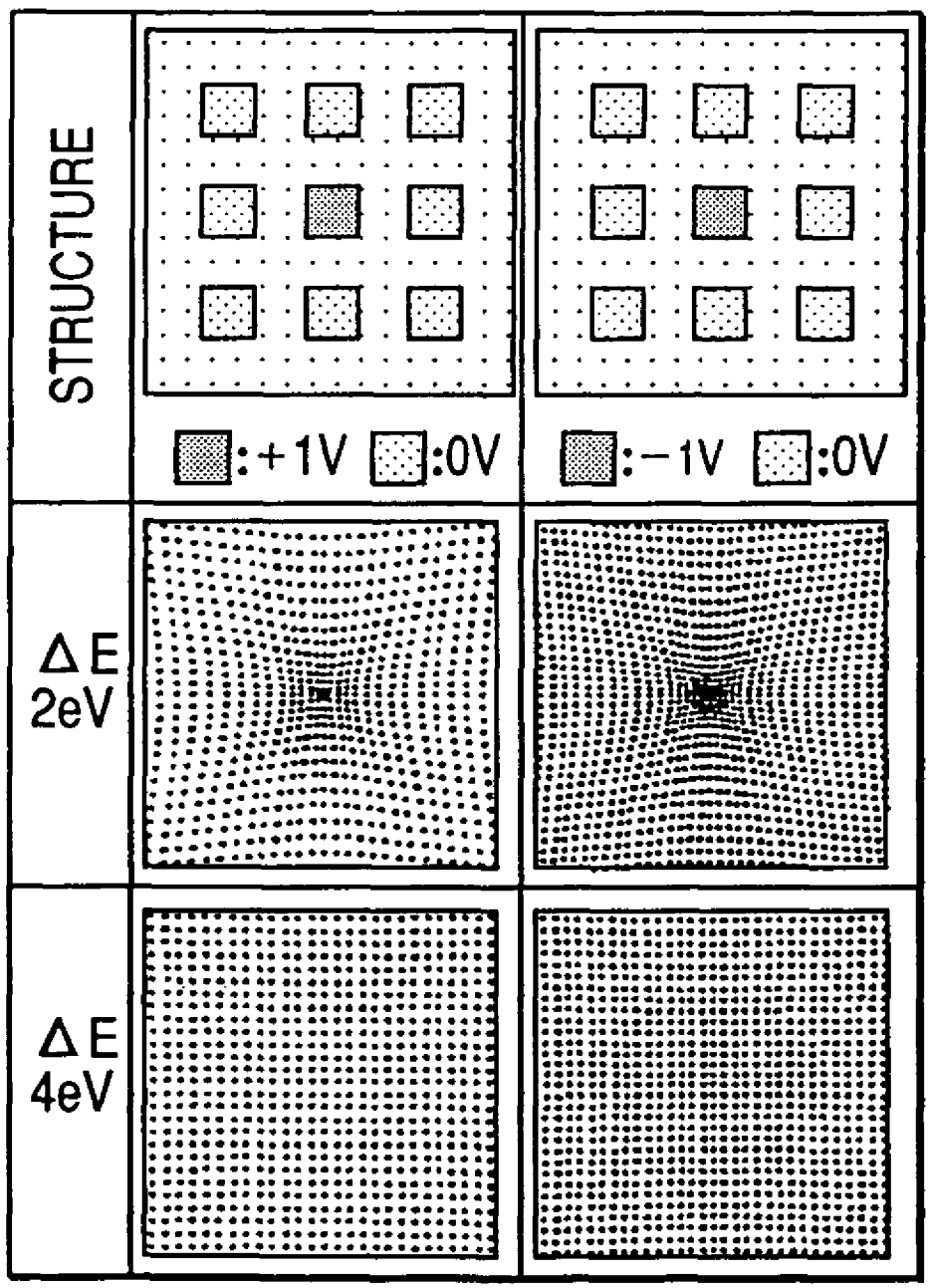
FIG. 10 is a diagram showing the relationship between the energy width of electron and the defect detection sensitivity.

In the principle of imaging according to the present invention, the sensitivity and resolution of the image required for detection of a minute difference in charge of the wafer surface are determined by the energy width of the sheet electron beam. FIG. 10 shows the results of simulations of the energy widths and the contrasts, in which the same pattern as in FIG. 4 is taken as an example, and images are obtained at energy widths (ΔE) of the electron beam of 2 eV and 4 eV, respectively.

The results show that an image obtained using an electron beam having an energy width of 4 eV exhibits no contrast on a portion having a different potential at the center of the pattern. In consideration of downsizing of semiconductor devices, the process must detect a difference of about 1 V in potential as a defect in fine patterns as shown in FIG. 10. Accordingly, the electron beam for use in the present invention should preferably have an energy width of less than or equal to 2 eV.

In the process according to the present embodiment using the Zr/O/W Schottky emitter, the electron beam has an energy width of 1.5 eV and can be used without problems. If an electron source emitting an electron beam having a larger energy width, the energy width of the electron beam must be reduced to 2 eV or less between the emission of electron beam from the electron source and the ultimate image formation by arranging an energy filter on the optical path of the electron beam, for example. The energy filter is preferably placed between the electron source and the wafer 7, but it is also acceptable to subject the mirror electron from the wafer 7 to energy filtering to yield similar advantages.

According to the present invention, the electron beam does not impinge on the wafer 7. Even if the wafer 7 carries an insulating film on its surface, the surface does not become charged in principle. Accordingly, if the wafer is inspected while carrying no charge, only shape defects in which the shapes are different from normal portions can be detected.

However, in addition to such pattern defects, "electric defects" such as faulty electrical continuity (open defects of via-hole and contact hole), electrical shortings of components to be insulated, and a larger leak current than that in normal portions, should be detected in wafer pattern inspection. In conventional technologies using electron beams, such electrical defects are charged by application of an electron beam, forming a scanning electron microscopic (SEM) image exhibiting a difference in potential as a voltage contrast, and detecting the electrical defects based on the voltage contrast.

To detect such electrical defects with high sensitivity, the apparatus according to the present embodiment further comprises a pre-charge control system which applies an electron beam dedicated to charge control to the wafer 7 prior to acquisition of images for inspection. By charging the wafer 7 to a predetermined potential with the pre-charge control system prior to inspection, electrical defects such as open defects of via-hole and contact hole, as well as shape defects, can be detected. The operation and configuration of the pre-charge control system will be illustrated below.

Figure 11:
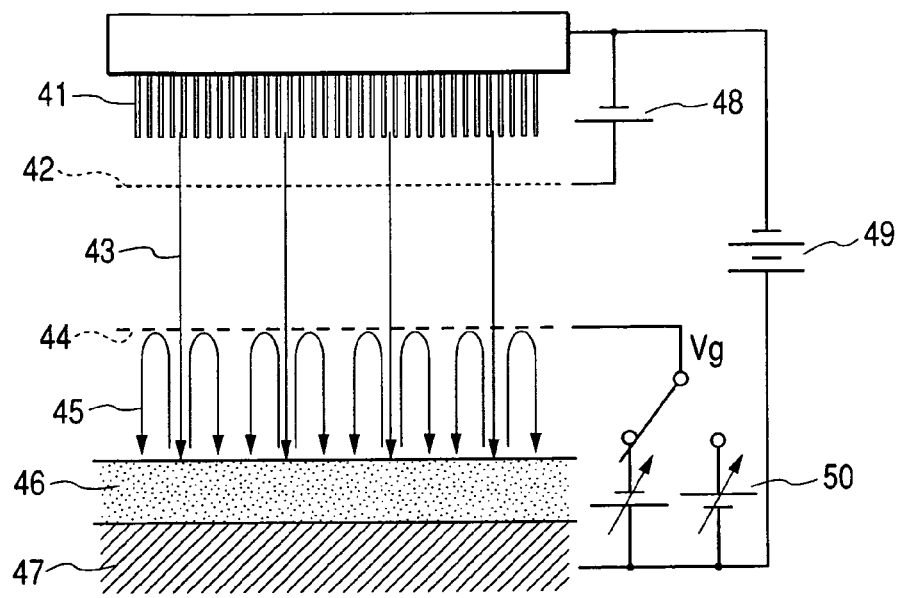
FIG. 11 is a diagram illustrating the principle of a pre-charge control system in First Embodiment of the present invention.

FIG. 11 is an explanatory diagram of the operation principle of the pre-charge control system. An electron source 41 emits a high current electron beam from a plane having a measure of size (several hundreds micrometers to several tens millimeters). Such electron sources include, for example, an electron source comprising bundled carbon nanotubes, a tungsten filament thermal emitter, and a $LaB_6$ emitter. An extract electrode 48 applies an extract voltage to an extract grid 42 to thereby allow the electron source 41 to emit an electron beam 43. The electron beam 43 passes through a control grid 44 and is applied to an insulating film 46. By this procedure, secondary electrons 45 are emitted.

The secondary electrons 45 each have an energy of about 2 eV with reference to a potential of the surface of the insulating film 46. If the surface potential of the insulating film 46 is equivalent to that of a substrate 47, the electron beam 43 has an illumination energy equivalent to the voltage of an accelerating power supply 49. The voltage of the accelerating power supply 49 is set at such a level that a secondary electron is more than 1. The voltage may be set at 500 V in insulating film materials for use in typical semiconductor devices. By the above procedure, the surface of the insulating film 46 becomes positively charged, since the secondary electron yield is more than 1.

A control power supply 50 is connected to the control grid 44 to apply an optional positive or negative voltage to the control grid 44. Accordingly, once the potential of the surface of the insulating film 46 becomes positive with reference to the set potential of the control grid 44 and the secondary electrons turn back toward the surface of the insulating film 46, positive charging of the surface of the insulating film 46 terminates. Thereafter, the surface of the insulating film 46 keeps a positive potential somewhat lower (about 2 V) than the potential of the control grid 44. Due to the energy of the secondary electron, the potential of the surface of the insulating film 46 does not become equal to that of the control grid 44. Based on the aforementioned principle, the potential of the surface of the insulating film 46 can be controlled by the potential of the control grid 44.

Figure 12:
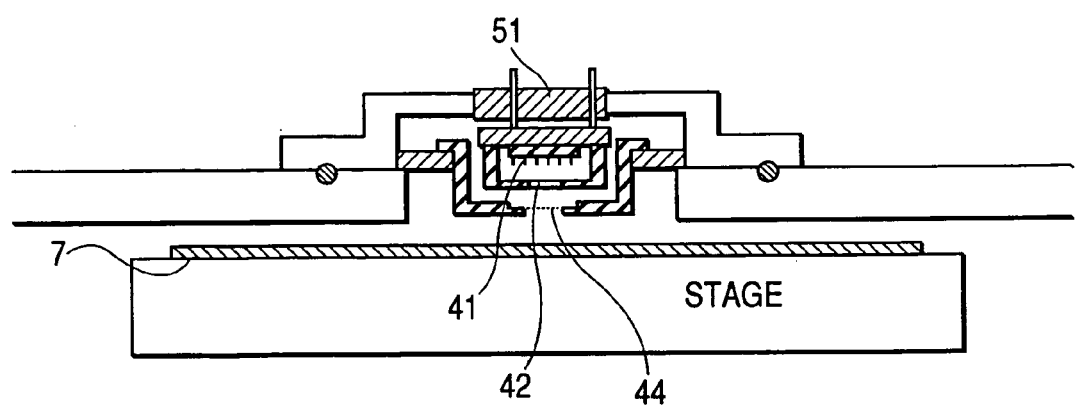
FIG. 12 is a diagram illustrating a configuration of the pre-charge control system in First Embodiment of the present invention.

FIG. 12 illustrates a configuration of a pre-charge control system using a carbon nanotube electron source. In this system, an electron source 41 is held in vacuo by an insulator 51 and serves to apply a potential. A control grid 44 faces a wafer 7, and an extract grid 42 extracts electrons from the electron source 41.

Figure 13:
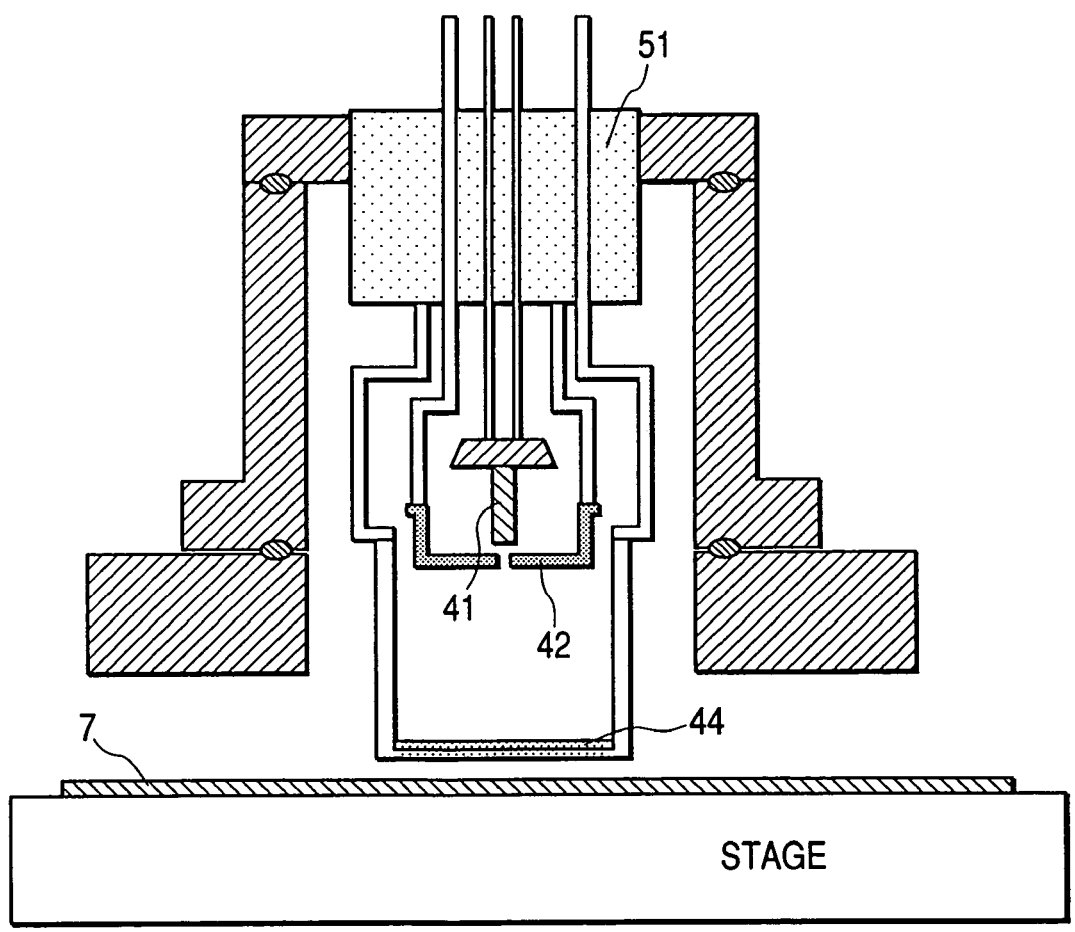
FIG. 13 is a diagram illustrating another configuration of the pre-charge control system in First Embodiment of the present invention.

FIG. 13 illustrates a configuration of a pre-charge control system using a LaB$_6$ emitter. When such a LaB$_6$ emitter is used in a microscope, a crossover is formed immediately after electron emission using a Wehnelt electrode. However, in this system, it is not required that the light source is small in size, and the system comprises an extract electrode 42' instead.

With reference to FIG. 9, the wafer 7 is placed on the sample stage 8 that is movable in two shapes (x and y directions) in the sample chamber 102. The power supply 9 applies such a negative potential to the wafer 7 that the great majority of the electron beam does not impinge on the wafer 7, as described above. The apparatus further comprises a stage-position measuring device 27 to determine the position of the sample stage 8 in real time accurately. The stage-position measuring device 27 is provided in order to acquire images while continuously moving the sample stage 8. A laser interferometer can be used as the stage-position measuring device 27, for example.

To determine the height of the surface of the semiconductor sample (wafer) 7 accurately, the apparatus further comprises an optical sample-height gauge 26. In the sample-height gauge 26, for example, light is allowed to enter a field to be inspected on the surface of the wafer from a slanting direction, and the height of the surface of the wafer 7 is determined based on a change in position of the reflected light. The sample chamber 102 further comprises an optical microscope 31 for registration of inspection fields.

Next, a stabilization time of the sample stage 8 will be described. If the sample stage 8 is moved in a step-and-repeat manner, the stabilization time of the sample stage 8 must be on the order of milliseconds. In this case, it takes much long time for the sample stage 8 to move even if the image signal to noise ratio is increased and the image acquisition time is shortened, and the inspection time cannot be shortened. Accordingly, the sample stage 8 moves continuously at an approximately constant speed in this embodiment. By this configuration, the stabilization time of the sample stage 8 does not limit the inspection time. However, the sample stage 8 thus continuously moves to thereby change the illumination position on the surface of the sample 7 even within one shot time which is a time required to form an image of one point. Accordingly, an illumination system deflector 5 makes the illumination electron beam follow the movement of the sample stage 8 in order to fix the illumination position during one shot. Likewise, the illumination point of the electron beam moves and an image 12 formed by the imaging lens 11 also moves relative to the electron optical system at rest with the movement of the sample stage 8. To avoid the movement of the image 12, the imaging system deflector 10 is operated so as to cooperate with the illumination system deflector 5.

Next, the image detection unit 103 will be illustrated below. To detect images, the phosphor screen 15 for converting a magnified image of the mirror electron image 12 into an optical image is optically connected with an optical image detection device (e.g., a CCD) 17 via an optical fiber bundle 16. By this configuration, an optical image on the phosphor screen 15 is projected onto an active area of the optical image detection device 17. The optical fiber bundle 16 comprises bundled fine optical fibers in the same number with that of pixels. Alternatively, instead of the optical fiber bundle 16, an optical lens is used to project the optical image on the phosphor screen 15 onto the active area of the optical image detection device (CCD) 17. The phosphor screen 15 carries an electrode 300 and a transparent electrode 301 on both sides, respectively, and a high voltage is applied between the two electrodes in such a manner that the transparent electrode 301 becomes positive to avoid scattering of the electron beam. The optical image detection device (CCD) 17 converts the optical image formed on its active area into an electric image signal and produces an output of the signal. The outputted image signal is transmitted to the image processing unit 104 and undergoes image signal processing therein.

Next, the read time of the image detection device (CCD) 17 will be described. According to the present embodiment, charges stored in the CCD 17 are read out from a 128-channel reader at a readout rate of 8 M line/second in a multichannel parallel readout manner. The number of pixels per channel per line is 8, and a readout time per line is 125 nanoseconds (nsec). Accordingly, a readout time per pixel is 125 nsec/8 pixel and is 16 nsec. In contrast, a process using readout from a CCD in one channel must read out at a very high speed and is not feasible.

Figure 14:
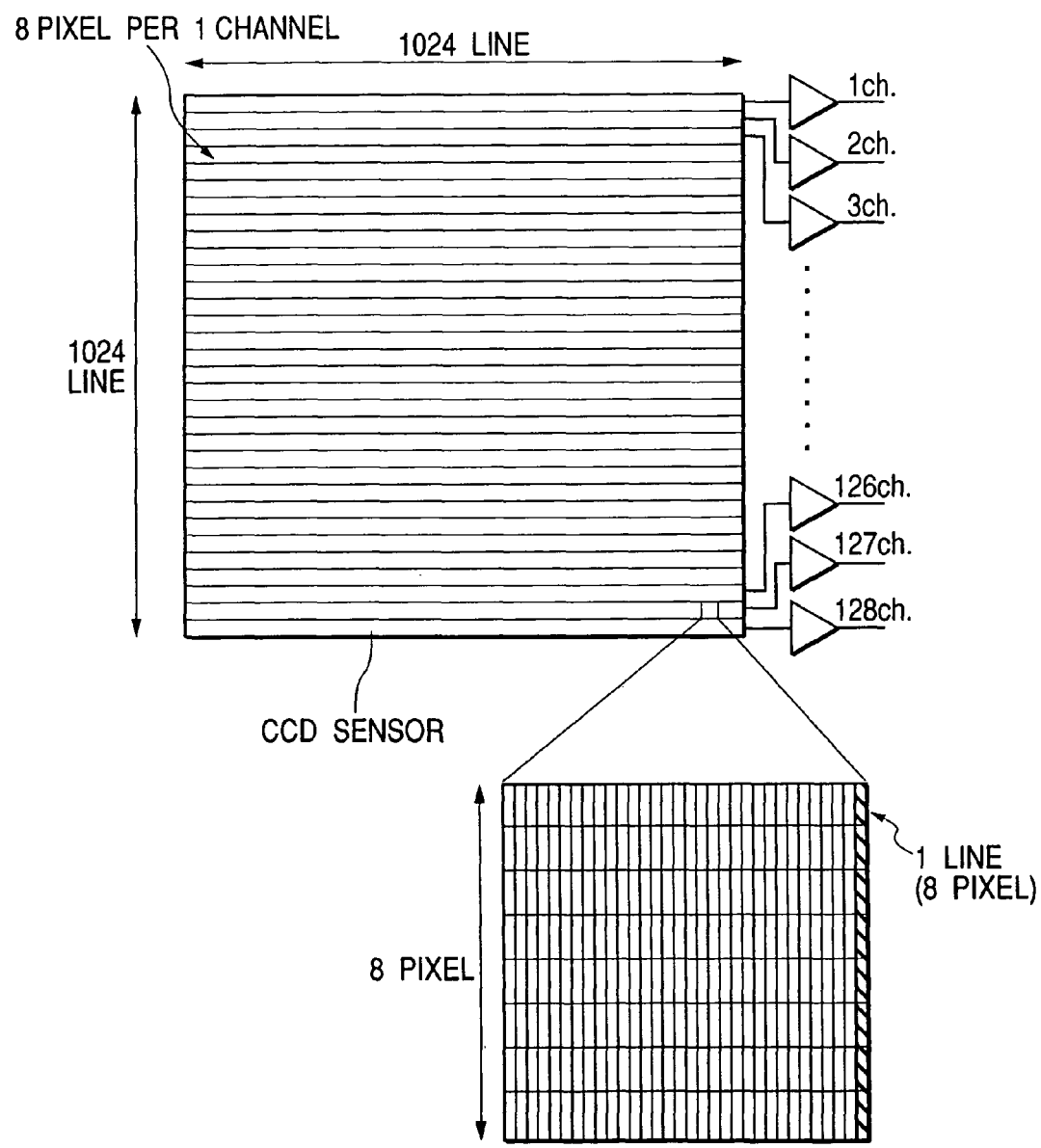
FIG. 14 is a diagram illustrating an image signal detection means according to First Embodiment of the present invention.

In the present embodiment, the reader of the image data from the CCD is divided into 128 channels, and the 128 channels read out the data in parallel concurrently. By this configuration, the readout time per pixel becomes 16 nsec which is sufficiently feasible. FIG. 14 schematically illustrates this configuration.

The number of the readout channels of the image data from the CCD 17 is 128, and each of the 128 channels comprises 8 pixels×1024 lines. Accordingly, the readout time for one image data from the CCD 17 is about 125 microseconds (μsec). Specifically, the system can capture an image signal per one shot area within 125 μsec. If the pixel size is set at 50 nm and one shot area is set at 50 μm square, the inspection time per square centimeter of the surface area of the sample is 5 sec.

According to the conventional processes, the inspection time per square centimeter of the surface area of the sample is about 400 sec provided that the pixel size is 50 nm. The process according to the present embodiment can inspect samples at a speed about 80 times higher than that in the conventional processes. According to the present embodiment, the inspection time is determined by the signal readout speed from the CCD 17. If a data readout process at a higher speed in a CCD is realized in future, the inspection will be possibly performed at a higher speed.

The image processing unit 104 comprises image signal memory units 18 and 19, a computing unit 20 and a defect determination unit 21. The image signal memory units 18 and 19 store images of adjacent portions having the same pattern, and the computing unit 20 performs computations on the two images to thereby detect a point at which the two images are different. The defect determination unit 21 interprets the result as a defect and stores its coordinates in memory. The captured image signal is displayed in a monitor 22 as an image.

A control computer 29 in the control unit 105 produces inputs and outputs of instructions and conditions of operations of individual units of the apparatus. The control computer 29 has been fed conditions such as an accelerating voltage upon generation of the electron beam, deflection width and deflection speed of the electron beam, a moving rate of the sample stage 8, and a capture timing of the image signal from the image detection device 17. Upon an instruction from the control computer 29, the beam control system 28 generates a correction signal based on signals from the stage-position measuring device 27 and the sample-height gauge 26 and transmits the correction signal to an objective lens power supply 25 and a scanning signal generator 24 so as to ensure the electron beam to be applied at a proper position always. The stage control system 30 controls the sample stage 8 upon an instruction from the control computer 29.

Next, practical inspection procedures will be illustrated below. Initially, the procedure for alignment using the optical microscope 31 and the electron beam image will be described. The wafer 7 is placed on the wafer (sample) stage (X-Y-θ stage) 8 and is moved to beneath the optical microscope 31. An optical microscopic image of the surface of the wafer 7 is observed with a monitor 22, and an optional pattern, for example, at the center in an image area is stored in memory. In this case, the selected pattern must be a pattern that can be observed even on an electron beam image.

Next, by rotating the wafer stage 8, the position of the wafer 7 is corrected so that the circuit pattern on the surface of the wafer 7 is in a direction parallel with or perpendicular to the direction of stage movement. Upon the rotation of the wafer stage 8 for correction, an optical image of an optional pattern in an optional chip of the circuit pattern on the surface of the wafer 7 at some stage position is captured and is displayed on the monitor 22, and an optional point in the image area is marked. Its optical image signal is then stored in the memory unit 18.

Next, the wafer stage 7 is moved in the X direction or y direction at a length corresponding to several chips of the circuit pattern on the surface of the wafer 7, and an optical image of a new chip at a portion having the same pattern with that of the previous chip is captured and displayed on the monitor 22. A point corresponding to the previously marked point is also marked, and the new optical image signal is stored in the memory unit 19. Subsequently, the optical image signals stored in the memory units 18 and 19 are compared with each other and are subjected to calculation of a misregistration of the marked points in the two images in the computation unit 20. Based on the misregistration of the marked points and the stage travel between the two images, a rotation angle error of the wafer 7 is calculated, and the wafer stage 8 is rotated at an angle corresponding to the error to thereby correct the rotation angle. The rotation correction procedure is repeated several times to thereby control the rotation angle error below a predetermined level.

Subsequently, the circuit pattern on the surface of the wafer 7 is observed with an optical microscopic image, and positions of chips and intervals between the chips (e.g., repeating pitch of a repeated pattern of a memory cell) on the wafer are determined previously, and the measurements are inputted to the control computer 29. A chip to be inspected on the surface of the wafer 7 and fields to be inspected in the chip are set on the optical microscopic image on the monitor 22. Such an optical microscopic image can be observed under a relatively low magnification. In addition, even when the circuit pattern on the surface of the wafer 7 is covered with a transparent film such as a silicon oxide film, the underlayer circuit pattern can be observed based on the optical microscopic image. Accordingly, a layout of the circuit pattern in the chip can easily be observed and the inspection fields can easily be set.

S The wafer 7 is then moved to underneath the electron optical system, and an electron beam image of a field expected to include the inspection field set on the optical microscopic image is obtained. In this procedure, the inspection field should be included in one shot area. The wafer stage 8 is moved so that the pattern of the previously marked point is present in the same image area in the electron beam image with that in the optical microscopic image. This procedure can coordinate the electron beam illumination position with the optical microscopic observation position prior to inspection and can calibrate the image acquisition position. The same procedure as in the optical microscopic image is then performed on the electron beam image. This procedure can yield simple check and alignment of the observation position using the optical microscope and can adjust the electron beam illumination position.

By using the electron beam image, the rotation can be corrected with further higher precision in addition to the rotation correction based on the optical microscopic image to some extent. Such an electron beam image has a higher resolution under a higher magnification than the optical microscopic image. In addition, by using the electron beam image, the inspection fields or the fields having the same pattern can be observed, checked and corrected with a high precision under a high magnification. However, when all or part of the surface of the semiconductor wafer 7 is covered with an insulator, a potential of the surface of the insulator is not equal to the potential of the substrate in some cases. The potential of the insulator surface must be controlled by the pre-charge control system 32 prior to the acquisition of the image in such cases.

After the completion of setting of the inspection conditions, an electron beam image of part of the inspection field on the surface of the semiconductor wafer 7 is formed under the same condition with that in the actual inspection. Based on the electron beam image, information on brightness of the image depending on the material and shape of the inspection field and its variation range are calculated and are stored as a table in memory. In the subsequent inspection process, an image of a pattern in the inspection field is actually formed and detected, and whether or not the pattern is a defect is determined based on the stored table. A criteria on this determination has previously been set.

After the completion of setting of the inspection field and defect determination criteria, an actual inspection is performed. Upon inspection, the sample stage 8 bearing the sample (semiconductor wafer) 7 thereon continuously moves in the X direction at a constant speed. During the movement, the electron beam is applied to one illumination field (an area field) on the surface of the wafer 7 during each one shot for a predetermined shot time (e.g., 50 μsec or more in the present embodiment). The electron beam is deflected and scanned following the continuous movement of the sample stage 8 by action of the illumination system deflector 5.

The illumination field or illumination position of the electron beam is continuously monitored by the stage-position measuring device 27, the sample-height gauge 26 and other devices arranged on the sample stage 8. The monitored information is transmitted to the control computer 29 to thereby grasp misregistration in detail, and the misregistration is accurately corrected by the beam control system 28. These procedures can perform accurate registration for comparison and inspection of the patterns at a high speed with high precision.

In addition, the height of the surface of the semiconductor wafer 7 is determined in real time by a means other than the electron beam, and the focal distances of the objective lens 6 for illumination of the electron beam and of the imaging lens 11 are corrected dynamically. Such other means than the electron beam include, for example, the optical height gauge 26 according to laser interferometry or according to measurement of a change in position of the reflected light. By this configuration, an electron beam image always focusing on the surface of the inspection field can be formed. Alternatively, the warpage of the wafer 7 has been determined prior to inspection, and the focal distances are corrected based on the measured data. In this case, there is no need of determining the height of the surface of the wafer 7 in the actual inspection.

The electron beam is directed to the surface of the wafer 7, and a magnified optical image of a desired inspection field (area field) on the surface of the wafer 7 is formed by action of the mirror electrons. The magnified optical image is then converted into an electric image signal by action of the CCD 17, and the image signal is captured into the image processing unit 104 and is stored as an electron beam image signal in the memory unit 18 or 19. The electron beam image signal is on the area field corresponding to the electron beam illumination position that is supplied by the control unit 28 upon the instruction from the control computer 29.

The patterns of adjacent chips A and B formed on the surface of the semiconductor wafer 7 and having the same design pattern are compared and inspected in the following manner. Initially, an electron beam image signal on an inspection field in the chip A is captured and is stored in the memory unit 18. Next, an image signal on an inspection field in the adjacent chip B corresponding to the inspection field in the chip A is captured, is stored in the memory unit 19 and, at the same time, is compared with the stored image signal in the memory unit 18. Subsequently, an image signal on a corresponding inspection field in an adjacent chip C is captured, is overwritten on the memory unit 18 and, at the same time, is compared with the stored image signal in the memory unit 19 on the inspection field in the chip B. By repeating this procedure, image signals on inspection fields in all the chips to be inspected are sequentially stored and are compared with one another.

As an alternative embodiment, it is also acceptable that an electron beam image signal of an optional inspection field on a non-defective (defect-free) sample has been stored as a reference standard in the memory unit 18 prior to inspection. In this embodiment, the inspection field and inspection condition on the non-defective sample are inputted into the control computer 29 in advance, the non-defective sample is inspected based on the inputted data, and an image signal obtained on the desired inspection field is stored in the memory unit 18. Next, the wafer 7 to be inspected is placed on the sample stage 8 and is inspected in the same manner as above.

An image signal acquired on an inspection field corresponding to the aforementioned inspection position is captured in the memory unit 19 and, at the same time, is compared with the image signal on the non-defective sample stored in the memory unit 18. By this procedure, the presence or absence of a pattern defect in the desired inspection field of the sample to be inspected is detected. As the standard reference (non-defective) sample, a wafer that is other than the sample to be inspected and has been verified to have no pattern defect can be used. Alternatively, a field (chip) which is on the surface of the sample to be inspected and has been verified to have no pattern defect can also be used. When patterns are formed on the surface of a semiconductor sample (wafer), misregistration (misalignment) between a lower pattern and an upper pattern overall the wafer may occur in some cases. In such cases, if patterns in the same wafer or in the same chip are compared for inspection, such a failure (a defect) occurring overall the wafer as above is overlooked and is not detected.

However, according to the aforementioned embodiment, the image signal on a field that has been verified to have no defect is stored in memory and is then compared with the image signal of the inspection field, and even such a failure (a defect) occurring overall the wafer can be detected with high precision.

The two image signals stored in the memory units 18 and 19 are captured into the computation unit 20, respectively. Based on the captured image signals, statistics, such as average and variance of image concentrations, and differences among adjacent pixels are calculated in the computation unit 20 under the defect criteria previously determined. The treated two image signals are transmitted to the defect determination unit 21 and are compared with each other to thereby extract difference signals between the two image signals. By comparing these difference signals with the defect criteria previously determined and stored, whether or not an image signal on a pattern field is defect is determined. The image signal on the pattern field determined as defect is distinguished from image signals on the other fields.

The method and apparatus for inspection as described above can detect the presence of a pattern defect by forming images reflecting the potential and shapes of the surface of the wafer 7, and comparing and inspecting image signals on corresponding pattern fields. The method and apparatus can inspect samples at a much higher speed than the conventional inspection processes and apparatus using electron beams.

Second Embodiment

According to First Embodiment, the area of an electron beam illumination field illuminated in one shot is significantly as large as of 50 μm square, and the magnified image of the semiconductor sample may have a deformed periphery or the beam current may not become satisfactorily uniform in density in the illumination field in some cases. When such image deformation or nonuniform current density occurs stationary, it can be corrected by changing the array of fiber wires of the optical fiber bundle 16 or by assigning weights to acquisition sensitivity or image processing of the image signals. However, if the image deformation and nonuniform current density vary with time, the techniques just mentioned above cannot remedy these problems.

Accordingly, in the present embodiment, an illumination filed per shot is set at 5 μm square to thereby avoid deformation of image and nonuniformity in current density in the illumination field during one shot. The illumination electron beam current per shot is 1 μA. Provided that electron imaging efficiency η is 0.5, the irradiation time t of the electron beam per shot is 0.18 μsec as calculated according to the equation (1). After illuminating one illumination field (5 μm square) with the electron beam for a shot time of 0.18 μsec, the electron beam is moved to another adjacent illumination field (5 μm square) by action of the illumination system deflector 5. By directing the electron beam to be applied to one illumination field after another in this manner, the overall area of 100

μm in the X direction and 100 μm in the y direction is illuminated in a total of 400 shots (20×20 shots).

Figure 15:
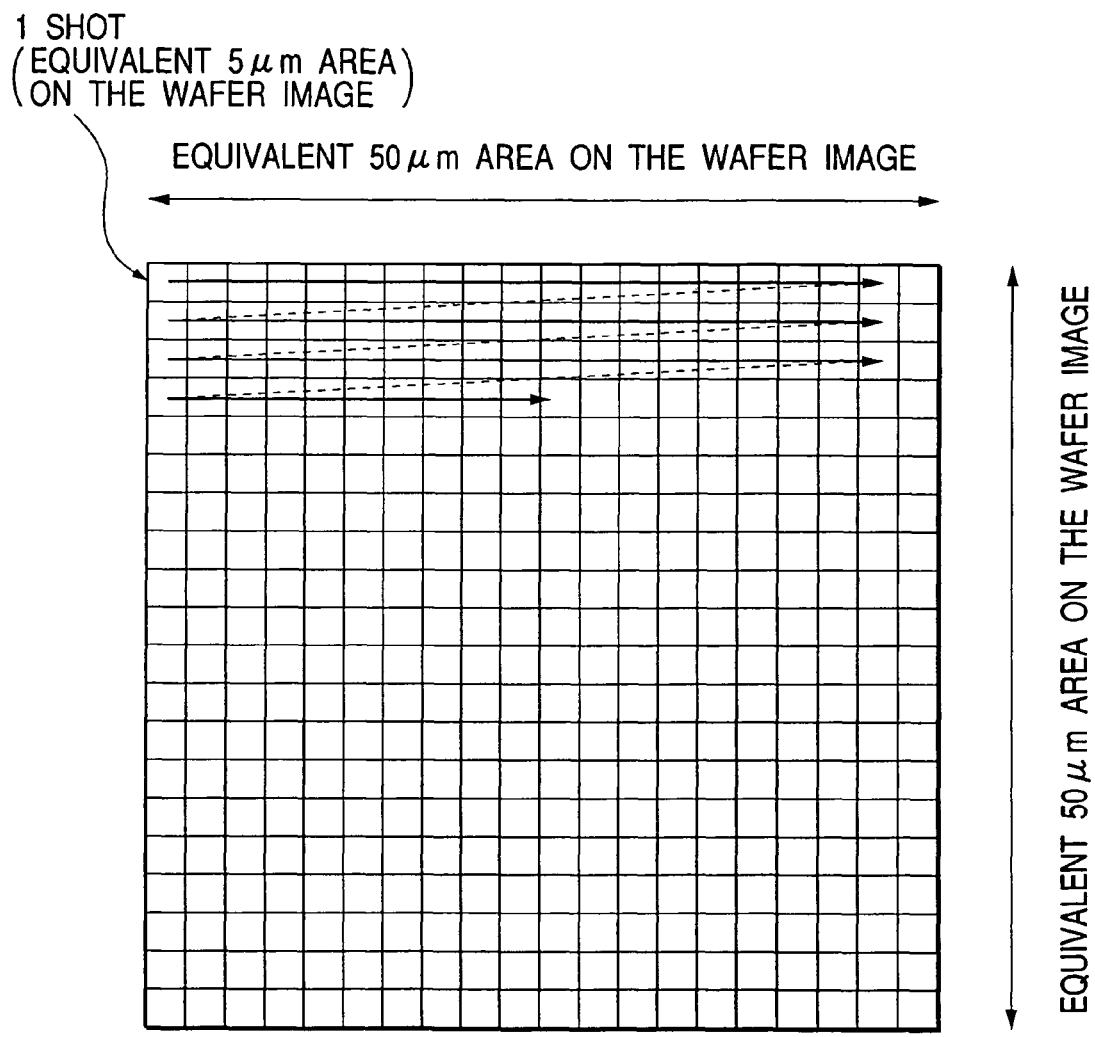
FIG. 15 is a diagram illustrating an image signal detection means according to Second Embodiment of the present invention.

In this procedure, a shot-to-shot magnified image is obtained on the CCD 17 at a position corresponding to the shot-to-shot electron beam illumination position, and the position of the magnified image on the CCD 17 moves with the movement of the electron beam illumination position caused by electron beam scanning, as shown in FIG. 15.

As the CCD 17, a CCD of 1024×1024 pixels is used herein. One pixel on the CCD 17 is equivalent to an area 50 μm square on the surface of the wafer 7. Accordingly, an illumination field (5 μm square) per shot on the surface of the wafer 7 is equivalent to an area of 100×100 pixels on the active area of the CCD 17, which is equivalent to one hundredth of the total active area of the CCD 17. The overall active area of the CCD 17 is set so as to cover an area 50 μm square on the surface of the wafer 7. Accordingly, it takes 18 μsec (0.18 μsec×100 shots) to obtain a magnified image of the area 50 μm square on the surface of the wafer 7.

Thus, the image of the field 50 μm square on the surface of the wafer 7 is formed on the CCD 17 over 18 μsec, and the image signals accumulated in the CCD 17 are stored as digital signals in the image memory unit 18. The wafer stage 8 must be moved by 50 μm in order to obtain image signals on another adjacent field on the surface of the wafer 7. In this embodiment, the wafer stage 8 continuously moves at a constant speed as in First Embodiment. To fix the relative position between the wafer stage 8 and the illumination electron beam so that as if the wafer stage 8 is still with respect to the illumination electron beam, the illumination electron beam is deflected and scanned by the illumination system deflector 5 so as to follow the movement of the wafer stage 8. This procedure avoids a waste of time caused by the movement and stopping of the wafer stage 8.

To scan the illumination electron beam so as to follow the continuously moving wafer stage 8, a correction signal for deflection signal is calculated in the beam control system 28 with reference to the signals from the stage-position measuring device 27, and the correction signal for deflection signal is transmitted to the illumination system deflector 5 to thereby control the deflection of the illumination electron beam. In addition, corrections on deformation and positional drift of the magnified image of the sample formed by the electron beam are superimposed on the correction signal for deflection signal to thereby correct these parameters. Additionally, the imaging system deflector 10 is also cooperated with the illumination system deflector 5 so as to remove influences of the movement of the electron beam position following the wafer stage 8 on the position of the magnified image of the sample on the CCD 17. These configurations and procedures eliminate a waste of time caused by stage movement and can inspect the sample at a high speed with high precision. The subsequent procedures such as image processing for defect inspection are the same as in First Embodiment.

By performing inspection according to the aforementioned procedures, the time T to form magnified images per square centimeter of the surface of the wafer 7 successively on the CCD 17 is 0.72 sec. In contrast, it takes 125 μsec to read one image (an image corresponding to an area 50 μm square on the surface of the wafer 7) from the CCD 17, and it takes 5 sec to read out image signals per square centimeter of the surface of the wafer 7 as in First Embodiment. The inspection time is a longer time between the time to form images or the time to readout the image signals, since image formation and image signal readout are performed in parallel in the CCD 17. In the present embodiment, the image signal readout time is longer than the image formation time and is 5 sec per square centimeter. Accordingly, the inspection time per square centimeter of the surface area of the sample is 5 sec.

The above description has been made by taking the case wherein the electron beam illumination field per shot is fixed to a size of 5 μm square as an example. However, it is also acceptable that the size of the electron beam illumination field is varied depending on the pattern repetition pitch on the surface of the semiconductor wafer 7. The size of an electron beam illumination field per shot is set small in the present embodiment, as described above. Accordingly, even if some deformations occur in joint portions between illumination area, an equivalent deformation at an equivalent point in each illumination field occurs, and deformations in two images to be compared occur in equivalent manner to thereby avoid false detection caused by deformation. This configuration can inspect a pattern defect with high reliability.

Third Embodiment

A time delayed integration CCD sensor is used as a device for converting images of the sample surface to electric signals in the present embodiment. This device is called as a TDI sensor and is generally used in optical inspection apparatus. The other configurations are the same as in Second Embodiment. A conceptual operation of the TDI sensor will be illustrated in detail below with reference to FIG. 16.

The TDI sensor operates so that a charge formed according to the intensity of light received in each active field is moved along the line in the X direction and, concurrently, charges formed according to the intensity of received light at positions after movement are sequentially added. The accumulated charge is outputted to the outside as an electric signal at the time when the charge reaches the final line of the active area. By equalizing the speed of the charge in the x direction and that of the image on the active area in the X direction, signals obtained during the movement of the image on the sensor are integrated and are outputted.

According to the present embodiment, by reading signals in 128 channels in parallel as in the CCD sensors in First and Second Embodiments, the reading speed is set at 4 M-line/sec. The TDI sensor used herein has an active field comprising 64 pixels in the X direction and 2048 pixels in the y direction. The lengths of one line in the x and y directions are equivalent to 50 nm and about 100 μm, respectively, on the wafer surface. In this procedure, images each 50 nm long and 100 μm wide are outputted at a speed of 4 M/sec., and thereby the wafer stage 8 continuously moves at a speed equivalent thereto (50 nm/250 nsec=200 mm/sec). The inspection field is moved in the X direction by moving the wafer stage 8 in this manner.

Figure 16:
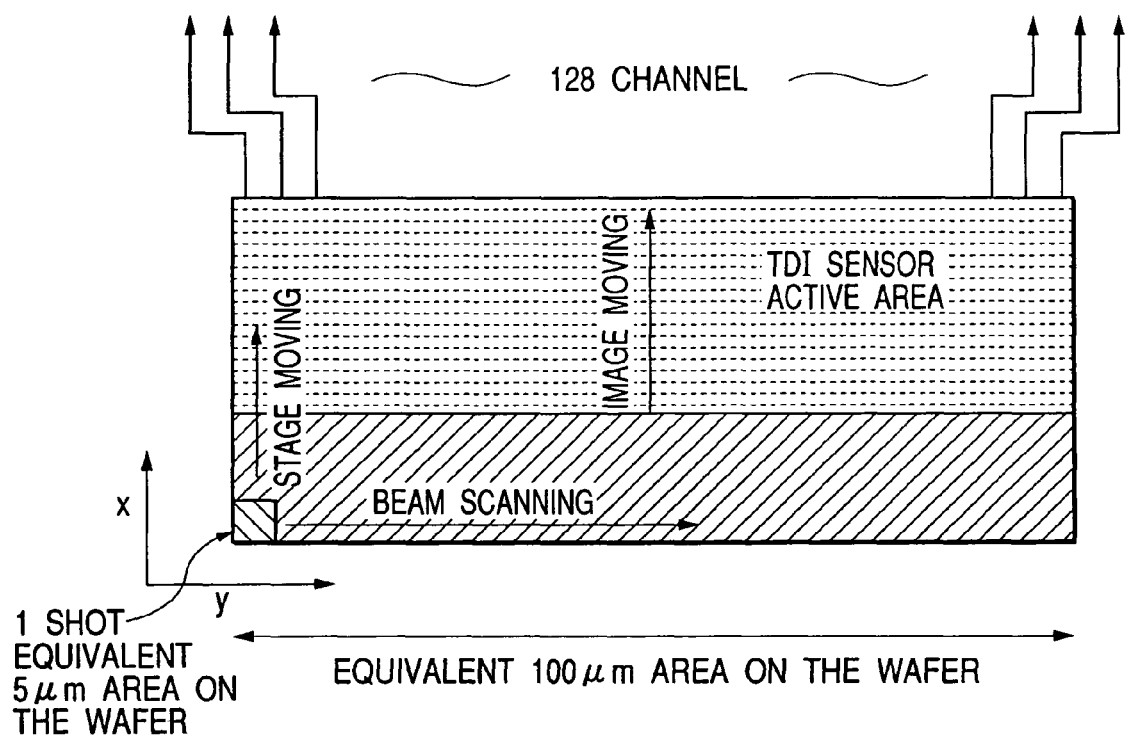
FIG. 16 is a diagram illustrating an image signal detection means according to Third Embodiment of the present invention.

One illumination field per shot is of 5 μm square, and the illumination field must be moved in the y direction by scanning of the electron beam, as shown in FIG. 16. Specifically, the electron beam must be scanned by 100 μm in the y direction during the movement of the wafer stage 8 in the x direction in one shot (5 μm). Provided that it takes 1.25 μsec for one shot, it takes 25 μsec to scan 100 mm (20 shots) in the y direction. The wafer stage 8 moves in the X direction at a speed of 200 mm/sec, and it takes 25 μsec for the wafer stage 8 to move in the X direction by one shot (5 μm). Thus, the time for the wafer stage 8 to move in the X direction by one shot (5 μm) is equalized with the time for the electron beam to scan in the y direction by 20 shots (100 μm) to thereby avoid a waste of time. According to this process, it takes a time $2 \times 10^5$ times the scanning time (25 μsec) per unit scanning field 5 μm in length and 100 μm in width to obtain an image equivalent to one square centimeter of the wafer surface area. The inspection time per square centimeter of the surface area of the wafer is therefore 5 sec.

The moving speed of the wafer stage 8 determined by the signal output speed of the TDI sensor is 200 mm/sec in the present embodiment. Accordingly, the inspection field can sufficiently be moved in the X direction by the movement of the wafer stage 8. In addition, during this duration of time, the electron beam can be allowed to scan the inspection filed in the y direction sufficiently. In the present embodiment, the signal output speed of the TDI sensor determines the inspection speed, and the process can inspect the sample at a higher speed if the signal output speed is improved.

Fourth Embodiment

Figure 17:
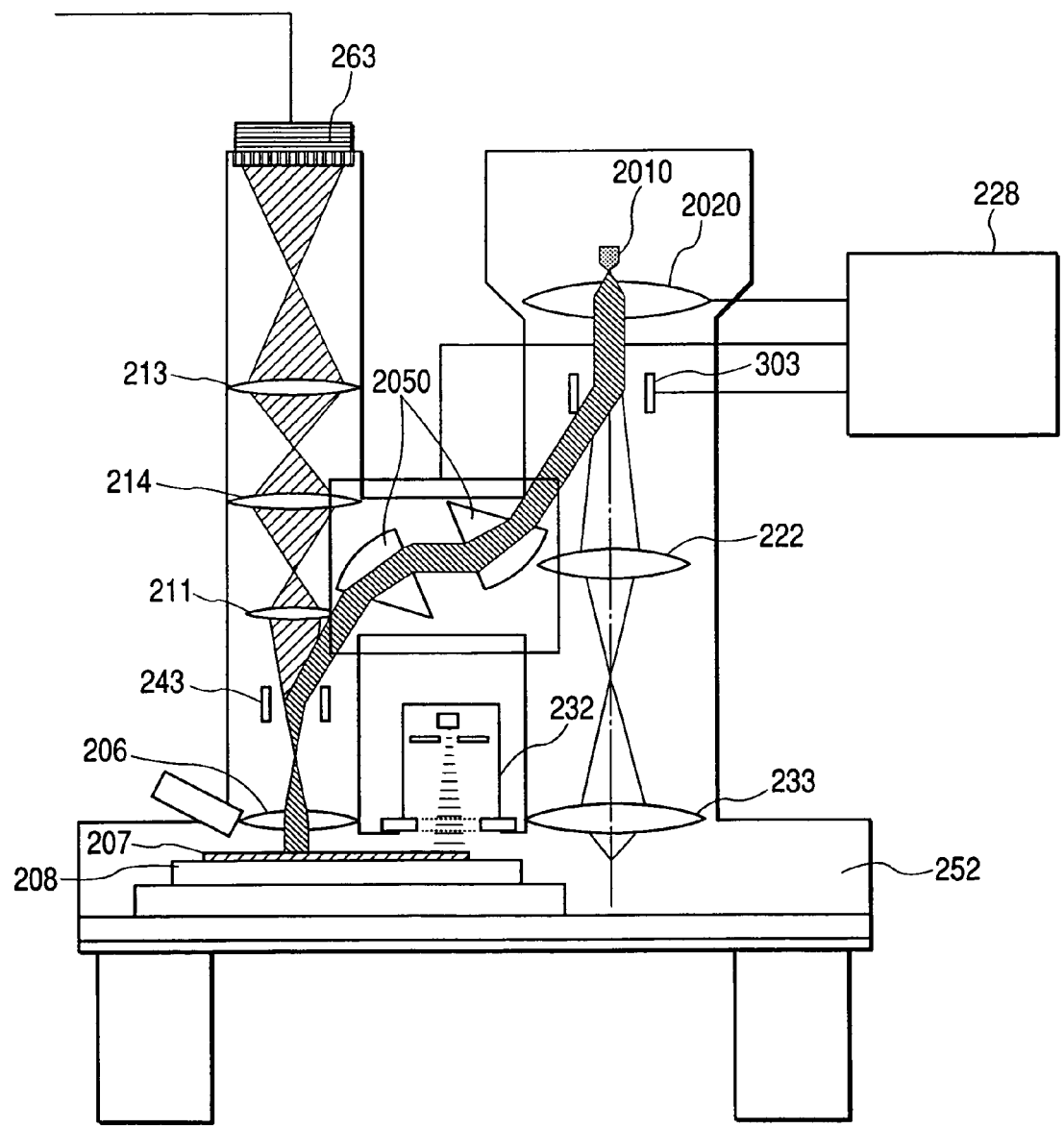
FIG. 17 is a diagram schematically illustrating a configuration of an electron optical system according to Fourth Embodiment of the present invention.

The apparatus according the present embodiment uses an electron optical system that can obtain scanning electron microscopic (SEM) images. FIG. 17 shows the configuration of the apparatus.

As an electron source 2010, a condenser lens 222 and a SEM objective lens 233, corresponding components constituting the electron optical system of scanning electron microscopes are employed as intact. A Zr/O/W Schottky emitter is used as the electron source 2010. Electrons are extracted from the electron source 2010, are deflected by a beam separator 303, are largely changed in angle by an electrostatic sector electrode electron defector 2050, are supplied to a beam separator 243 and vertically enter an objective lens 206. The resulting electron beam forms a crossover in the front focal plane of the objective lens 206 and is converted into a sheet electron beam by action of the objective lens 206. The electrons constituting the sheet electron beam are uniform in a direction perpendicular to the surface of a wafer 207. A voltage to be applied to the wafer 207, the arrangement of an aperture and other configurations are the same as in First Embodiment.

One of the features of the present embodiment is that a scanning electron microscopic image can be observed with high resolution without taking the wafer 207 out of the apparatus. This is significantly advantageous when an image of a detected defect after wafer inspection should be observed in detail. Specifically, a scanning electron microscopic image at an optional position of the wafer 207 can be observed by allowing the electron beam to go straight without the operation of the beam separator 303, and moving the wafer 207 to beneath the optical axis of the SEM objective lens 233 by action of a wafer stage 208. FIG. 17 also illustrates an imaging lens 211, magnifying lenses 213 and 214, a SEM condenser lens 222, a beam control system 228, a pre-charge control system 232, a sample chamber 252, and an image detection unit 263.

The aforementioned function according to the present embodiment can also be applied to pattern check of wafers prior to inspection, setting of inspection conditions, and alignment in addition to observation of detected defects.

Fifth Embodiment

Figure 18:
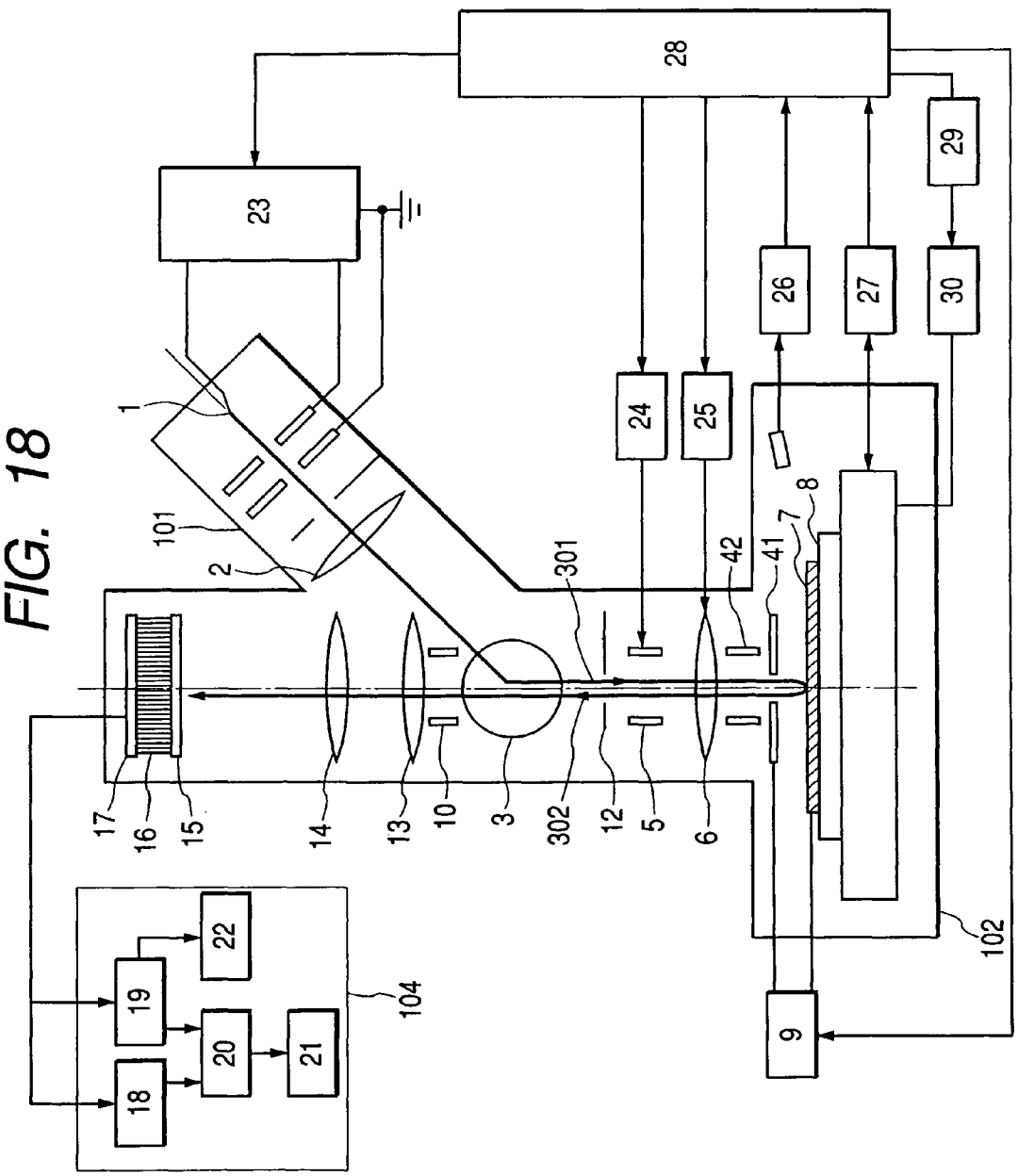
FIG. 18 is a diagram schematically illustrating a configuration according to Fifth Embodiment of the present invention.

The apparatus and method according to the present embodiment comprise a means or device for applying two electron beams at approximately the same position at approximately the same time. One of the two electron beams is an electron beam that impinges on the sample to form a potential difference between a normal pattern and a defective pattern, and the other is an electron beam that is reflected without impingement on the sample and forms a mirror electron image. FIG. 18 illustrates the configuration of the apparatus. An electron beam is emitted from an electron source 1, is deflected into an optical axis direction perpendicular to a wafer 7 by action of a beam separator 3 and passes through an objective lens 6 to form a sheet incident electron beam 301. The electrons constituting the incident electron beam 301 are uniform in a direction perpendicular to the surface of the sample (wafer) 7. A sample power supply 9 applies a negative potential approximately equivalent to the voltage of the electron source 1. The sample power supply 9 can also set a potential difference between an aperture lens electrode 41 and the sample 7 to thereby vary an electric field between the aperture lens electrode 41 and the sample 7. The electric field between these components serves to decelerate the incident electron beam. For example, to detect a shape defect, the detection sensitivity of a shape defect can be increased by setting the electric field for deceleration at a higher level than normal cases. The incident electron beam 301 is rapidly decelerated between the aperture lens electrode 41 and the sample 7 and is absorbed by the sample 7 or changes in direction directly above the sample 7 to form a mirror electron beam 302 by action of an electric field. The electric field reflects the shape and charge of semiconductor patterns formed on the surface of the sample 7.

When the sample 7 carries an insulator on its surface, the incident electron beam 301 is injected into the sample 7 to make the insulator charged, and an image is obtained. FIGS. 19(*a*), 19(*b*), 19(*c*) and 19(*d*) are sectional views illustrating a sample. In the sample, an insulating film ($SiO_2$ film) 311 is formed on a silicon (Si) substrate 310 to form a wafer, and contact holes are formed on the wafer and are filled with tungsten (W) to form tungsten electrodes. The electrodes include normal electrodes 312 in conduction with the substrate 310 at a low resistance and a faulty electrode 313 at the center. The faulty electrode 313 is not in satisfactory conduction with the substrate 310 due to its high resistance caused by a residue of $SiO_2$ at the bottom of the electrode 313.

Figure 19A:
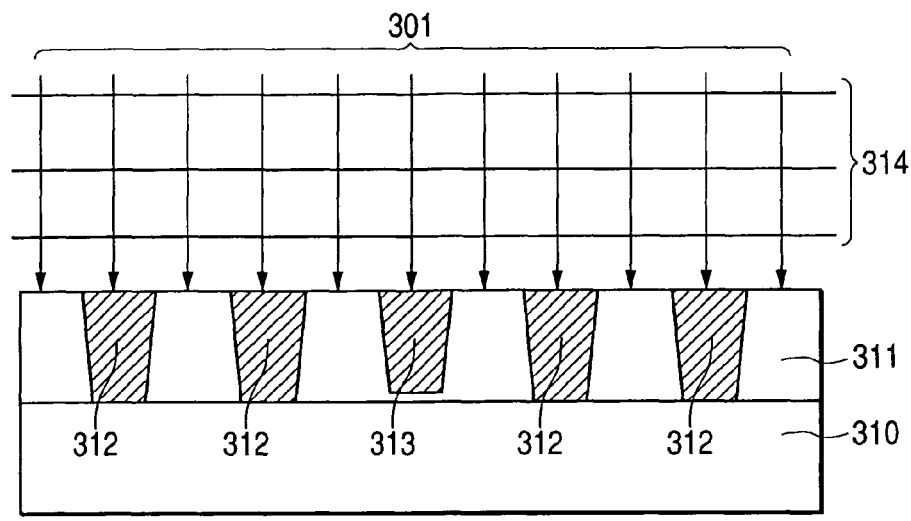
FIGS. 19($a$), 19($b$), 19($c$), and 19($d$) are diagrams illustrating control of charging according to Fifth Embodiment of the present invention.
Figure 19B:
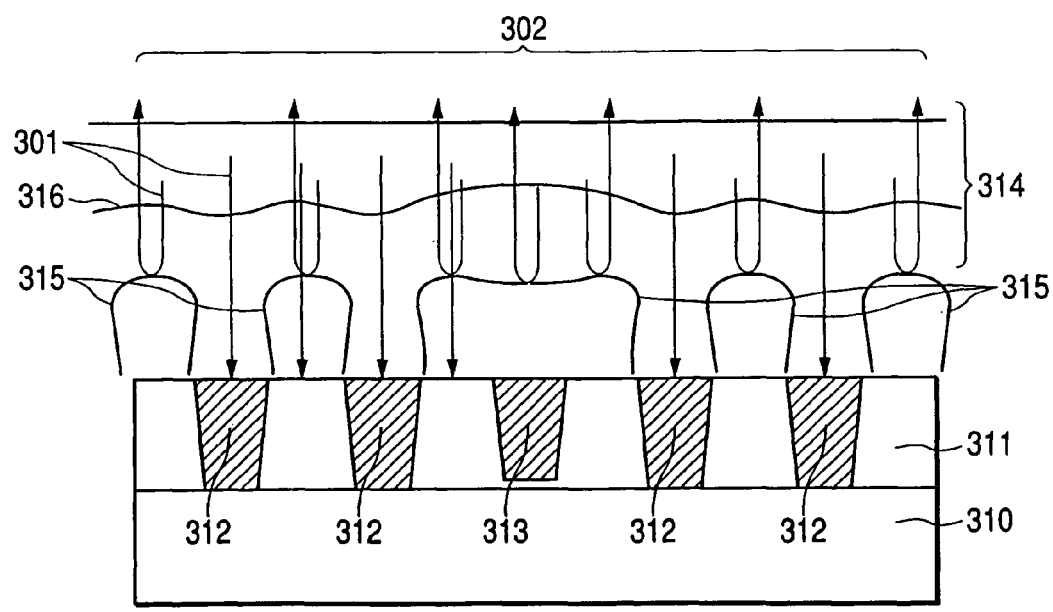

When an electron beam having a very low energy with a mean number of secondary electrons excited per incident electron of less than 1 is applied to an insulator, the insulator becomes negatively charged by accumulation of negative charges (electrons). For example, when an electron beam having an illumination energy of less than or equal to about 30 eV is applied to $SiO_2$, the mean number of secondary electrons excited per incident electron is less than 1, and the $SiO_2$ becomes negatively charged. FIG. 19(*a*) illustrates early stages of negative charging of the insulating film 311 in which an incident electron beam is applied thereto. The incident electron beam 301 applied to the sample 7 has an energy spread including an illumination energy eV0 at the early stages before the sample 7 becomes charged. In this procedure, the illumination energy is determined by the potential difference between the sample 7 and the electron source 1 and by the energy spread of the incident electron beam 301. By keeping application of the incident electron beam 301 to the sample 7, the negative charge of the insulating film increases until it repels the incident electron beam having a low energy, and is stabilized at a potential at which the number of electrons entering the insulating film 311 balances the number of electrons escaping from the insulating film 311 to surroundings. In the case where electrons accumulated in the insulating film 311 do not escape to surroundings, the insulating film 311 becomes negatively charged to a potential at which the incident electron beam 301 does not enter the insulating film 311. Likewise, the electrodes become charged to a potential at which the number of electrons entering becomes proportional to the number of electrons escaping from the electrodes to surroundings. Specifically, the normal electrodes 312 are in conduction with the substrate 310 at a low resistance, allow electrons injected thereinto to escape to the substrate 310, and thereby become little charged negatively. In contrast, the faulty electrode 313 has a high resistance to thereby prevent electrons to escape to surroundings and becomes negatively charged. With reference to FIG. 19(b), equipotential surfaces 314 reflect the potentials of these electrodes 312 and 313, and the insulating film 311. An equipotential surface 315 of V0 is formed approximately directly above the insulating film 311 and the faulty electrode 313 and reflects part of the incident electron beam 301 having an energy lower than energy V0. In contrast, the equipotential surface 315 of V0 is not formed approximately directly above the normal electrodes 312, and the incident electron beam 301 impinges on the normal electrodes 312. Accordingly, an image of the mirror electron beam 302 reflects a difference in dimensions (shapes) of equipotential surfaces approximately directly above the normal electrodes 312 and the faulty electrode 313.

Figure 21A:
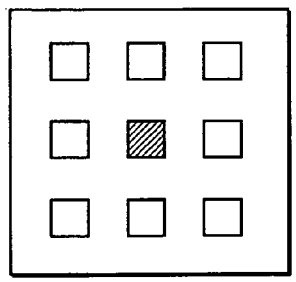
FIGS. 21(a) and 21(b) are diagrams illustrating examples of images of defects according to Fifth Embodiment of the present invention.

FIG. 21(a) is a schematic diagram of a mirror electron image obtained in the following manner. A sample comprises 70 nm×70 nm square plug patterns arrayed three columns wide and three rows deep including normal portions of 0 V, a faulty portion at the center of −1 V, and a $SiO_2$ film of −2 V. An electron beam having an energy higher by about 1.2 V than the potential of the normal portions of 0 V is applied to the sample and is reflected to form the mirror electron image. In the normal portions, electrons impinge on the pattern and are absorbed, and the normal portions exhibit dark contrast patterns. In contrast, an open defect of via-hole and contact hole at a high resistance is negatively charged and repels the electrons without impingement to form an image, and the open defect can be detected as a bright contrast pattern.

The charged potential of the insulator 311 depends on the energy eV0 of the incident electron beam 301 and can optionally be controlled by varying the energy of the incident electron beam 301.

All the electrons of the incident electron beam 301 having an energy of eV1 with respect to the potential (0 V) of the substrate 310 of the sample are reflected upon the equipotential surface of 316 of V1, and the shape of the equipotential surface 316 greatly differs between the vicinity directly above the normal electrodes 312 and the vicinity directly above the faulty electrode 313. Accordingly, an image of the mirror electron beam 302 formed by reflecting the electrons of the incident electron beam 301 having an energy of eV1 can distinguish the normal electrodes 312 and the faulty electrode 313.

Figure 20:
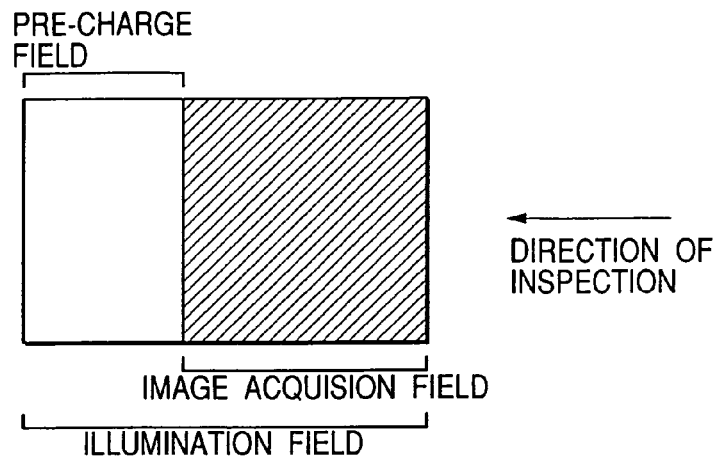
FIG. 20 is a diagram illustrating an image acquisition field and an illumination field in Fifth Embodiment of the present invention.

The time to stabilize the potential of the insulating film is roughly estimated as follows. Assuming that this configuration is a parallel-plate capacitor comprising electrodes sandwiching an insulating film, the capacitance of the capacitor C is expressed by the following equation: $C=\epsilon 0 \epsilon S/D$, wherein D is the thickness of the insulating film; S is the area of the electrodes; $\epsilon 0$ is the electric constant; $\epsilon r$ is the dielectric constant of the insulating film. For example, when a current of 1 μA is applied to an insulating film having a thickness of 0.4 μm and a $\epsilon r$ of 4 in an irradiation area of 20 μm square, it takes about 35 nsec for the insulating film to be charged at a voltage of 1 V, and the insulating film is charged and stabilized within a moment. In the cases where the insulating film is not charged and stabilized within a moment, an electron beam illumination field is set in front in the direction of inspection (direction of scanning) in an area larger then an image acquisition field to thereby apply the electron beam prior to the image acquisition, as shown in FIG. 20. Alternatively, when the electron beam illumination field is set in an area approximately equal to that of the image acquisition field, the image acquisition circuit is controlled so as to apply the electron beam to the image acquisition field and to acquire the image after the charge of the image acquisition field becomes stable.

Secondary electrons are formed from the wafer 7 as a result of impingement of the incident electron beam 301 on the wafer (sample) 7, in addition to the mirror electron beam 302 which is reflected without impingement on the wafer 7. The angles of secondary electrons distribute as shown in FIG. 7. By downsizing the contrast aperture 12 arranged in the vicinity of the back focal plane of the objective lens 6, almost all the secondary electrons having an angular distribution as above can be absorbed by the contrast aperture 12 to thereby allow the electron beam which is reflected-without impingement on the sample 7 alone to form an image.

Figure 19C:
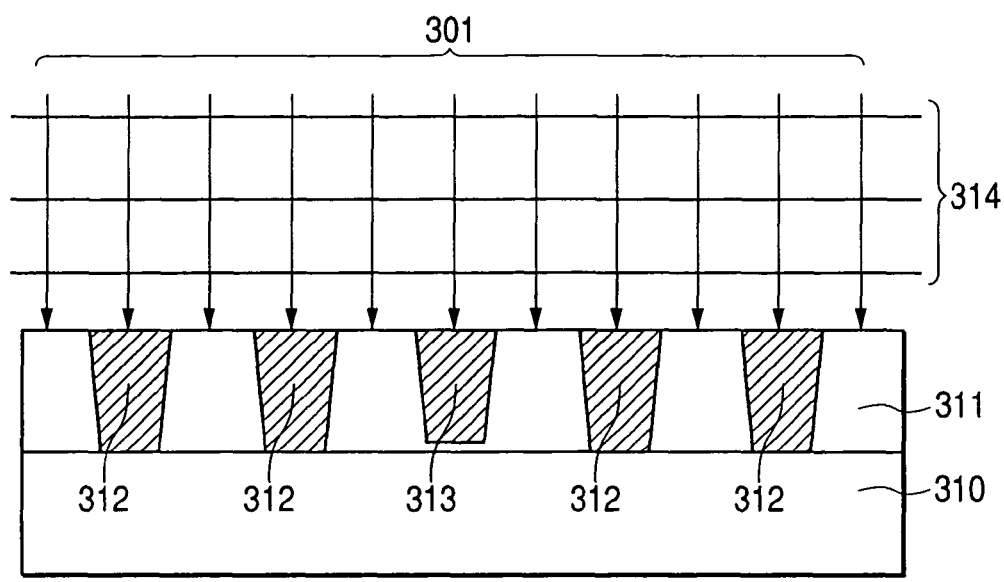
Figure 19D:
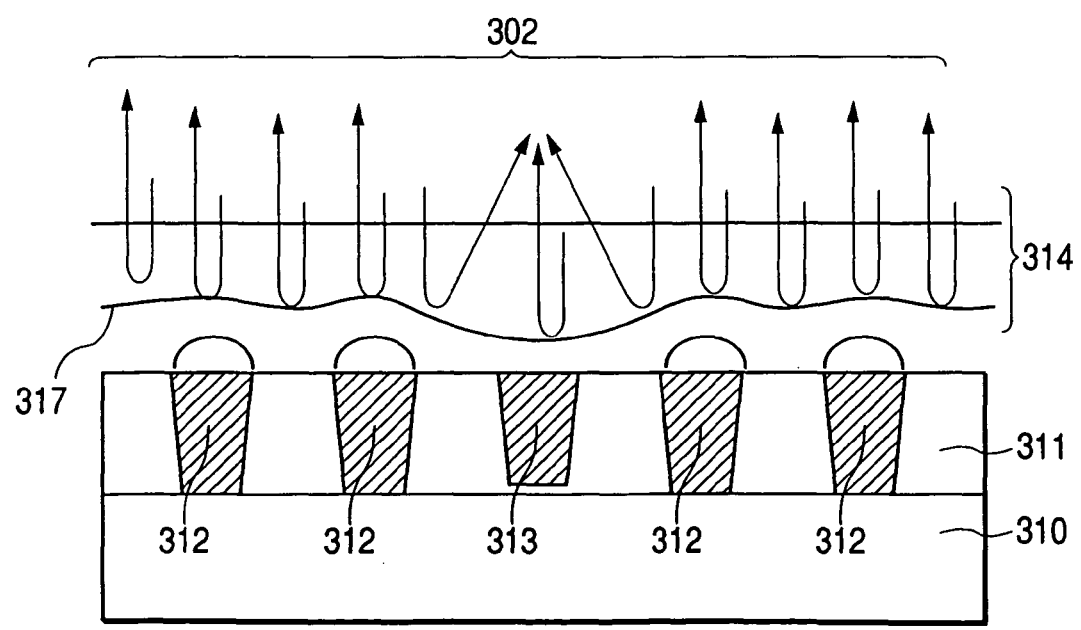

To detect electrical defects, the moving direction of electrons in the pattern must also be controlled depending on the state of junction with the substrate 310. Accordingly, there is also a need to charge the insulating film 311 positively in addition to charge the same negatively. To charge the insulating film 311 positively, an electron beam having a mean number of secondary electrons excited per incident electron of more than 1 must be applied. FIG. 19C illustrates early stages of illumination of the electron beam to charge the insulating film 311 positively. Initially, an incident electron beam 310 having an energy of eVb with respect to the sample potential is applied to the sample 7. When Vb is set at 500 V, for example, the mean number of secondary electrons from the sample 7 excited per incident electron is more than 1, the insulating film 311 becomes positively charged, the positively charged insulating film 311 yields a potential barrier, the potential barrier turns back electrons to the sample, and the turned-back electrons stabilize the potential of the insulating film 311. Thus, the charging of the insulating film proceeds until the potential is stabilized. After the insulating film 311 and the faulty electrode 313 become positively charged, an electron beam having an energy of eVp which does not impinge on the insulator pattern is applied as shown in FIG. 19(d). By this procedure, deformation in potential of positively charged portions can be detected, since an equipotential surface 317 of Vp greatly varies between the vicinity directly abode the normal electrodes 312 and the vicinity directly above the faulty electrode 313. When the energy of the incident electron beam 301 is increased, the incident electron beam 301 impinges on the insulating film 311 prior to the pattern due to positive charge of the insulating film 311. If the incident electron beam 301 impinges on the insulating film 311, the positively charged potential of the insulating film 311 is reduced. The energy of the incident electron beam 301 applied to the sample 7 must be controlled so as to prevent the incident electron beam 301 from impinging on the insulating film 311. However, the potential of the positively charged insulating film 311 can be controlled by applying an electron beam for positive charging and an electron beam for image acquisition to the sample 7 concurrently. This is because the potential of the positively charged insulating film 311 is stabilized under such a condition that the injection of electrons into the insulating film 311 due to the impingement of the electron beam for image acquisition is in equilibrium with the flow of electrons from the insulating film 311 due to application of the electron beam for positive charging.

Figure 21B:
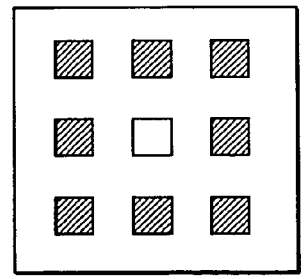

FIG. 21(b) is a schematic diagram of a mirror electron image obtained in the following manner. Specifically, the sample comprises electrodes arrayed three columns wide and three rows deep. The normal electrodes 312, the faulty electrode 313 at the center and the insulating film 311 are charged at 0 V, +1 V and +2 V, respectively, and the incident electron beam 301 having an energy 1.9 V lower than the potential of the normal electrodes 312 of 0 V to form a mirror electron image. An equipotential surface formed between the sample 7 and the aperture lens 41 differs in shapes between the vicinity of the normal patterns and the vicinity of the faulty pattern by reflecting the potential difference between the normal electrodes 312 and the faulty electrode 313. The trajectories of electrons which are reflected without impingement on the sample 7 greatly depend on the shape of the equipotential surface at the position where they are reflected. Accordingly, the position of image formation largely differs between an electron beam reflected in the vicinity of the normal pattern and an electron beam reflected in the vicinity of the faulty pattern. With reference to FIG. 21(b), the object plane of a projection lens is set in the vicinity of the imaging plane of electrons reflected in the vicinity of the normal patterns, and the normal patterns yield bright contrast patterns. Alternatively, the object plane of the projection lens may be set in the vicinity of the imaging plane of electrons reflected in front of the faulty pattern, and in this case, an image shown in FIG. 21A is obtained, which is an inverted image relative to the image in FIG. 21(b).

Figure 22:
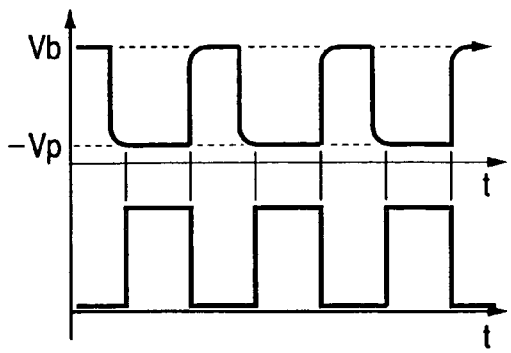
FIG. 22 is a diagram illustrating control of a voltage applied to the sample in Fifth Embodiment of the present invention.

To perform the above procedures with one electron source, a relative potential between the sample power supply 9 and the electron source power supply (accelerating power supply) 23 may be periodically switched. Specifically, the voltage applied to the electron source power supply 23 or to the sample power supply 9 may be periodically switched. For example, the voltage applied to the electron source power supply 23 is periodically changed with reference to the voltage of the sample power supply 9, as shown in FIG. 22. Initially, the electron beam is moved to a predetermined inspection field using the sample stage 8 or the illumination system deflector 5, a voltage of +Vb, for example 500 V, for positively charging the sample 7 is applied from the electron source power supply 23 to the electron source 1 to apply the electron beam to the inspection field for a predetermined time to thereby charge the inspection field positively. Next, the voltage applied to the electron source power supply 23 is switched to the voltage for image acquisition of −Vp and is applied to the electron source 1. Thus, an electron beam having an energy lower by −eVp than the potential of the sample 7 is applied to the predetermined inspection field, and by repeating this procedure periodically on every inspection field, images can continuously be obtained while keeping the sample 7 positively charged.

Sixth Embodiment

Figure 23:
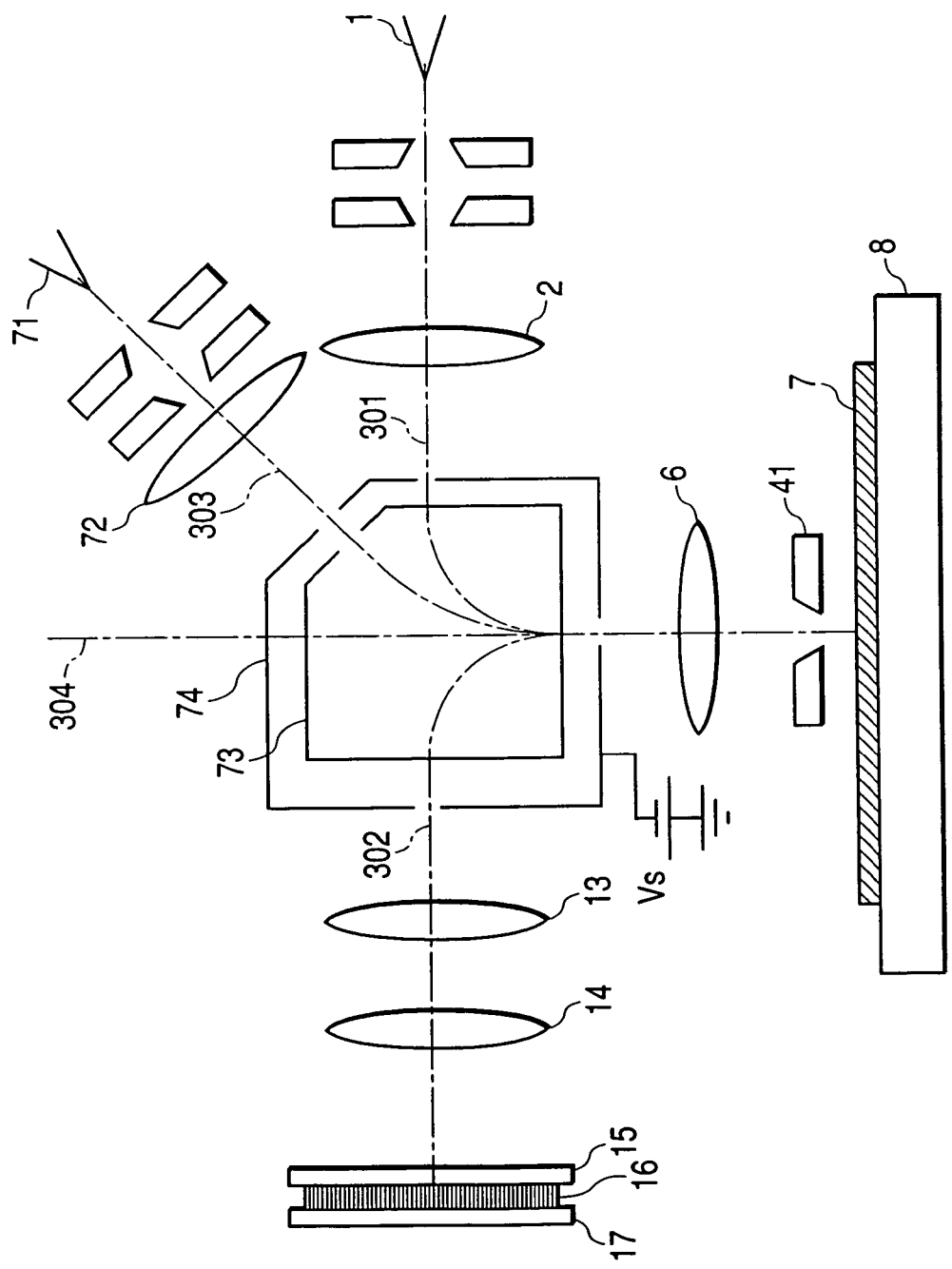
FIG. 23 is a diagram illustrating a configuration according to Sixth Embodiment of the present invention.

The apparatus according to the present embodiment further comprises an electron source for concurrently applying an electron beam having a mean number of secondary electrons excited per incident electron of more than 1, in addition to an electron source for applying an electron beam that turns back in front of the sample to form an image. By this configuration, the sample is positively charged and images are obtained concurrently. FIG. 23 illustrates the configuration of the apparatus.

An electron source 1 has a potential slightly more positive than that of a wafer 7. An incident electron beam 301 emitted from the electron source 1 turns back directly above the wafer 7 to form a mirror electron beam 302. A second electron source 71 has a potential difference of about 500 V with respect to the wafer 7, and an electron beam 303 emitted from the second electron source 71 has an energy of 500 eV and is applied to the wafer 7. A magnetic prism 73 is covered with a shield electrode 74 floated at a potential of Vs.

Accordingly, an electron beam entering the magnetic prism 73 is decelerated and is deflected by an energy of eVs. In contrast, en electron beam emitted from the magnetic prism 73 is accelerated by an energy of eVs. For example, the electron beam 301 emitted from the electron source 1 is decelerated to about 500 V immediately in front of the magnetic prism 73 and enters the magnetic prism 73. The electron beam 303 emitted from the second electron source 71 is decelerated to about 1000 V immediately in front of the magnetic prism 73 and enters the magnetic prism 73. When the magnetic flux density in the magnetic prism 73 is set at 5 gausses, the electron beam 301 and the electron beam 302 enter the same optical axes 304 in trajectories of cyclotron radii of 150 mm and about 210 mm, respectively. By this procedure, one inspection field can be illuminated with two electron beams having different energy concurrently. The mirror electron beam 302 turned back in the vicinity directly above the sample 7 enters the magnetic prism 703 and is deflected in the opposite direction to the incident electron beam and is projected via an intermediate lens 13 and a projection lens 14 onto a phosphor screen 15.

Seventh Embodiment

Figure 24:
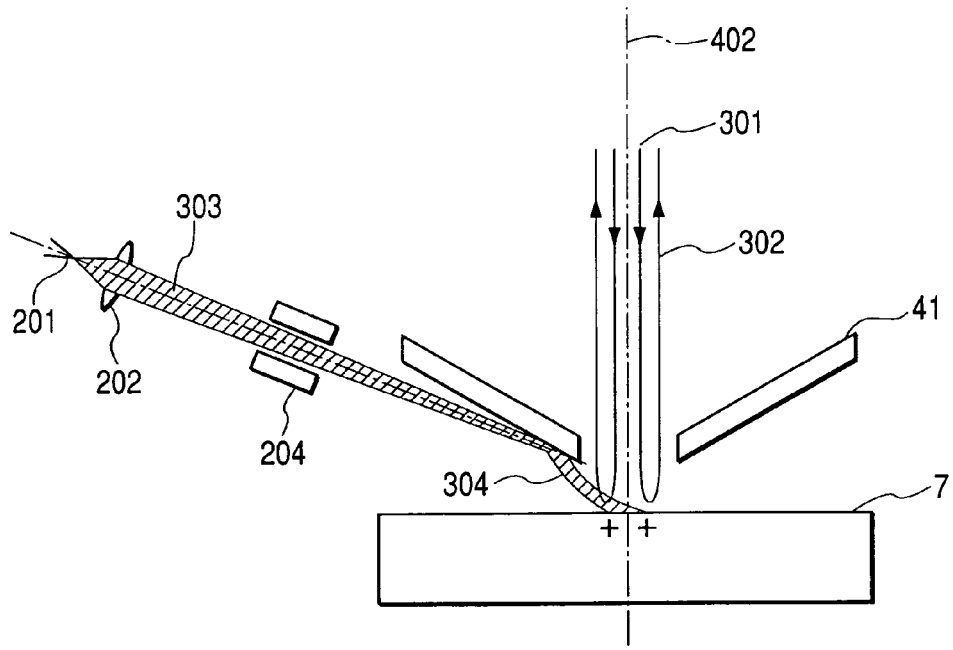
FIG. 24 is a diagram illustrating a configuration according to Seventh Embodiment of the present invention.

With reference to FIG. 24, the apparatus according to the present embodiment includes a second electron source 71 and a second illumination lens 72. In this apparatus, an electron beam 303 is emitted from the second electron source 71 and impinges on a lower part of an aperture lens electrode 41 to yield elastically scattered electrons 304. The elastically scattered electrons 304 are then applied to a sample 7. If an energy component of the elastically scattered electrons 304 in the optical axis direction is larger than the energy reduced by action of the voltage applied between the aperture lens electrode 41 and the sample 7, the elastically scattered electrons 304 reach the sample surface. For example, when the elastically scattered electrons 304 have a peak in directional distribution at an angle of 30 degrees to the optical axis 402, the sample 7 can be charged positively by accelerating the electron beam 303 emitted from the second electron source 71 at a voltage of 1077 V. The voltage of 1077 V is 577 V higher than the voltage of 500 V applied between the aperture lens electrode 41 and the sample 7. The voltage of 577 V equals 500 V/cos 30°. The angle and position of the electron beam 303 brought into impingement on the lower part of the electrode 41 are set so that the electron beam 303 has approximately the same illumination position with the illumination electron beam 301 for imaging in consideration that the elastically scattered electrons 304 change their trajectories in the electric field for deceleration. The apparatus further includes an aligner 75 which is capable of inclining the beam and moving the beam position to thereby control the illumination position of the electron beam 303.

Eighth Embodiment

Figure 25:
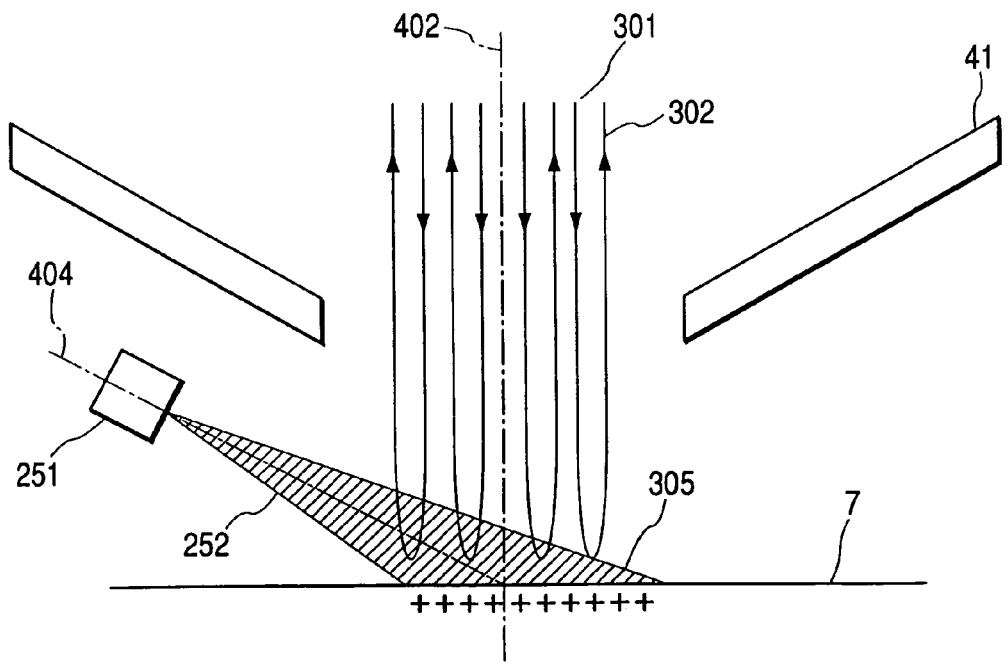
FIG. 25 is a diagram showing a configuration according to Eighth Embodiment of the present invention.
Figure 26A:
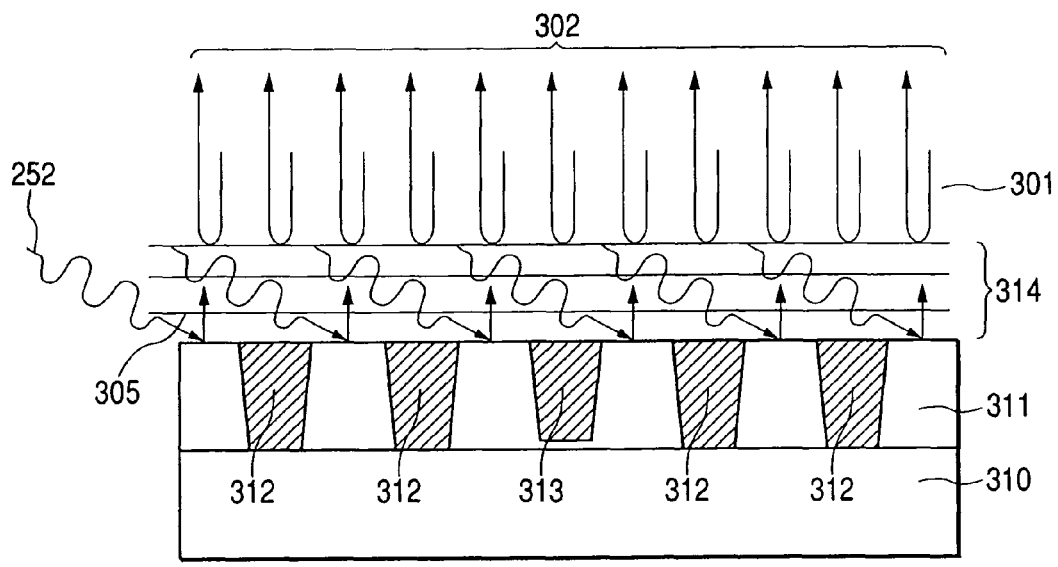
FIGS. 26(a) and 26(b) are diagrams illustrating control of charging according to Eighth Embodiment of the present invention.
Figure 26B:
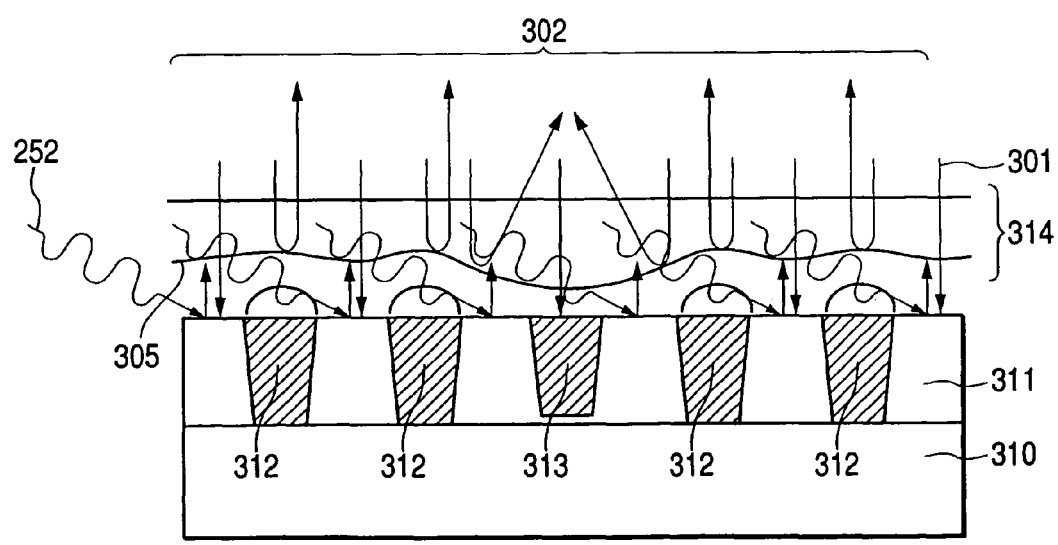

With reference to FIG. 25, the apparatus according to the present embodiment includes a light source 251 as a means for charging a sample 7 to thereby apply a light ray 252 to the sample 7 concurrently with an electron beam. By applying a light ray having an energy larger than work functions of materials constituting the sample 7 to the sample 7, the sample 7 emits photoelectrons and is thereby positively charged. FIGS. 26(a) and 26(b) are sectional views of the sample 7 in which an insulating film ($SiO_2$ film) 311 is formed on a silicon (Si) substrate 310 to form a wafer, and contact holes are formed on the wafer and are filled with tungsten (W)

plugs. An open defect with a high resistance due to a residue of SiO$_2$ is present at the bottom of a plug at the center.

FIG. 26(a) illustrates early stages in which an incident electron beam is applied to allow an insulating film 311 to be positively charged. The potential of an electron source 1 is set at a positive potential +Vp with respect to the potential of the sample 7, an electron beam 301 emitted from the electron source 1 is decelerated between an aperture electrode 41 and the sample 7 and changes its direction in the vicinity directly above the sample 7 to form a mirror electron beam 302. The work function of SiO$_2$ is about 9 eV. Accordingly, by applying ultraviolet rays having an energy higher than 9 eV as the light ray 252 concurrently, the insulating film 311 composed of SiO$_2$ emits photoelectrons 305. Accordingly, the insulating film 311 becomes positively charged and an equipotential surface 314 in the vicinity directly above the insulating film 311 curves as shown in FIG. 26(b). When the insulating film 311 becomes further positively charged, part of the incident electron beam 301 reaches the insulating film 311, and the positively charged potential of the insulating film 311 is stabilized under such a condition that the amount of the photoelectrons emitted from the insulating film 311 becomes equal to the amount of the incident electron beam 301 reaching the insulating film 311. An image of the mirror electron beam 302 formed in this state includes a dark portion corresponding to the insulating film 311 and reflects the potential deformation in the vicinity of the insulating film 311. Thus, the resulting image exhibits a high contrast between the normal portions and the abnormal (faulty) portion. An optical axis 404 of the light ray 252 emitted from the light source 251 and an optical axis 402 of the illumination electron beam 301 are controlled so that the light ray 252 and the illumination electron beam 301 approximately coincide with each other on the sample 7. When the illumination field of the light ray 252 on the sample 7 is set larger than the illumination field of the illumination electron beam 301, and the stage is moved to acquire the image continuously, it is also accepted that the light ray 252 is applied to the sample 7 to thereby charge the sample 7 positively, and then the illumination electron beam 301 is applied to the sample 7. The photoelectrons 305 generated concurrently can be absorbed by a contrast aperture 12 arranged in the light path of the mirror electron beam 302 to thereby yield a mirror electron image with a high contrast.

Ninth Embodiment

Figure 27:
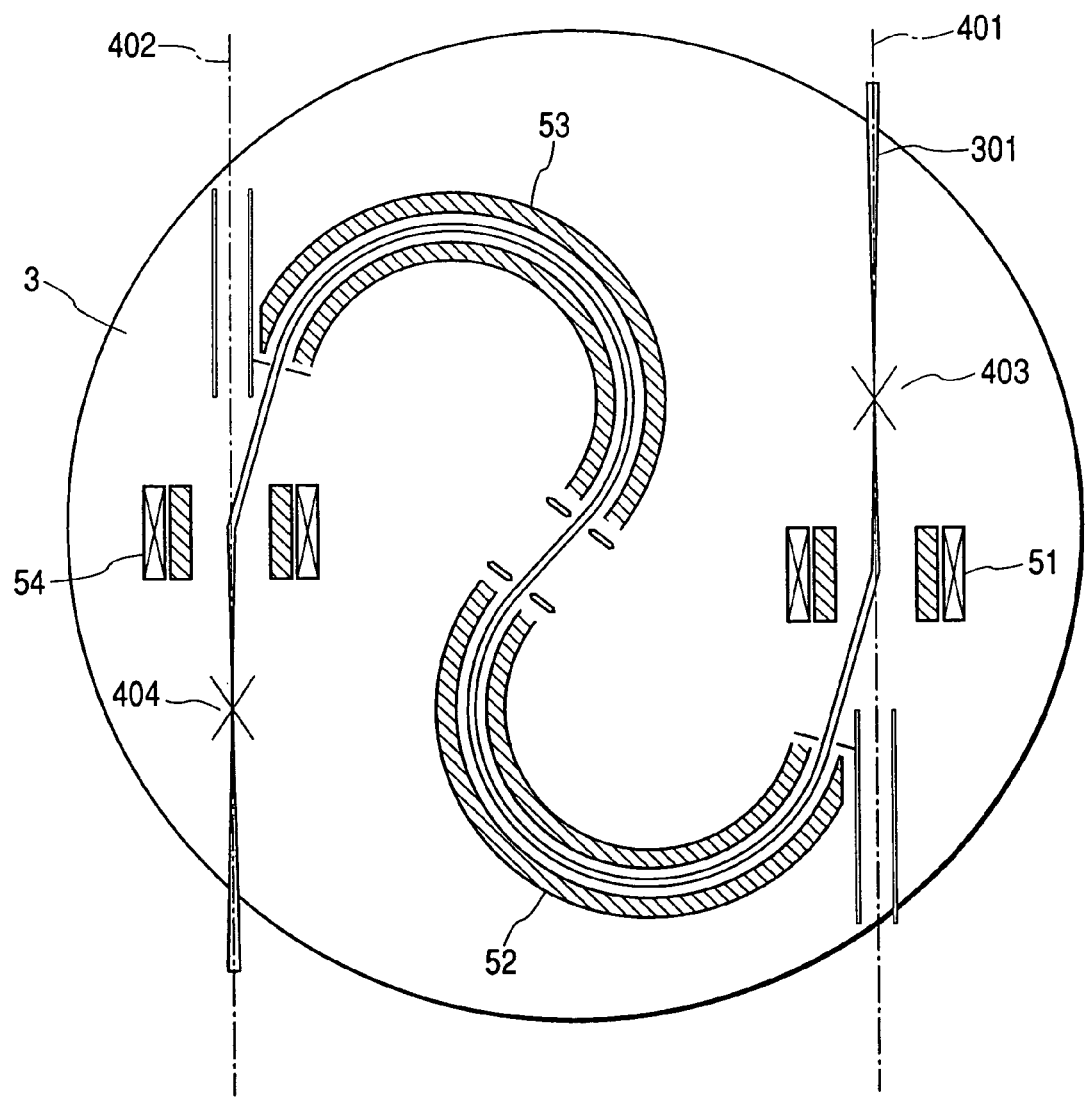
FIG. 27 is a diagram illustrating a configuration according to Ninth Embodiment of the present invention.

According to the present embodiment, two E×B deflectors and two spherical electrostatic prisms are used in combination as the beam separator 3 to thereby separate an incident electron beam from a mirror electron beam. FIG. 27 schematically illustrates the configuration of the apparatus according to the present embodiment. In this configuration, the mirror electron beam reflected from the sample is set so as to travel in a straight line in an E×B deflector 54. In addition, with respect to an incident electron beam 301, the aberrations of the illumination system and the imaging system can be reduced by operating the two E×B deflectors in the opposite directions and by operating the two electrostatic prisms in the opposite directions to thereby optimize conditions for the lenses to form images. Additionally, the imaging system and the illumination system can be arranged in a direction perpendicular to the stage to thereby minimize effects of, for example, mechanical vibration on the electron optical system. The configuration of this apparatus will be described in further detail below. When the mirror electron beam reflected from the sample enters the E×B deflector 54, the E×B deflector 54 operates so as to cancel the activities of a magnetic field and an electric field with each other to allow the mirror electron beam to travel in a straight line in the E×B deflector 54. In addition, by positioning an image point of the mirror electron beam in the vicinity of the E×B deflector 54, the lens aberration generated in the E×B deflector 54 is minimized. The incident electron beam 301 emitted from the electron source forms an image on an imaging point 403 on an optical axis 401 by action of a condenser lens, enters an E×B deflector 51 and is deflected at an angle of about 15 degrees. The deflected incident electron beam 301 enters an electrostatic prism 52, travels in a circular trajectory while rotating at a predetermined angle and is converged. The incident electron beam 301 exits the electrostatic prism 52, enters the electrostatic prism 53, rotates in the opposite direction and is converged. The incident electron beam 301 exits the electrostatic prism 53, enters the E×B deflector 54, is deflected at an angle of about 15 degrees in the opposite direction as in the E×B deflector 51, enters the optical axis 402 of the objective lens in the illumination system to thereby form an image at the image point 404. The aberration between the two electrostatic prisms can be corrected almost completely by controlling the distance between the electrostatic prism 52 and the image point 401 to be approximately equal to the distance between the electrostatic prism 53 and the image point 404 and by operating electrostatic prisms 52 and 53 in such a manner that the incident electron beam 301 exits the electrostatic prism 52 approximately in parallel and enters the electrostatic prism 53 approximately in parallel.

For example, when the incident electron beam 301 having an incident energy of 10 keV enters the electrostatic prism 52 having a rotation angle of 200 degrees and a radius of 50 mm from a distance of about 170 mm corresponding to a distance between the electrostatic prism 52 and the condenser lens image point 403, the incident electron beam 301 becomes approximately parallel when it exits the electrostatic prism 52. Thereafter, the incident electron beam 301 enters the electrostatic prism 53, exits the same and converges at a symmetric point at a distance of about 170 mm from the electrostatic prism 53 corresponding to a distance between the electrostatic prism 53 and the image point 404. Under this condition, the aberrations between the electrostatic prism 52 and the electrostatic prism 53 cancel with each other and become approximately zero, and the incident electron beam 301 with a high intensity can be applied to the sample.

Tenth Embodiment

A configuration according to the present embodiment includes a means for accurate inspection even if the height or inclination of the sample varies. A large-diameter wafer invites warpage and other deformation and thereby varies in its height and/or inclination largely in the wafer plane. Accordingly, the configuration for use herein should essentially have a means for avoiding image point variation even if the sample height changes, and a means for ensuring an incident electron beam enters the sample always vertically even if the sample inclination changes.

Figure 28:
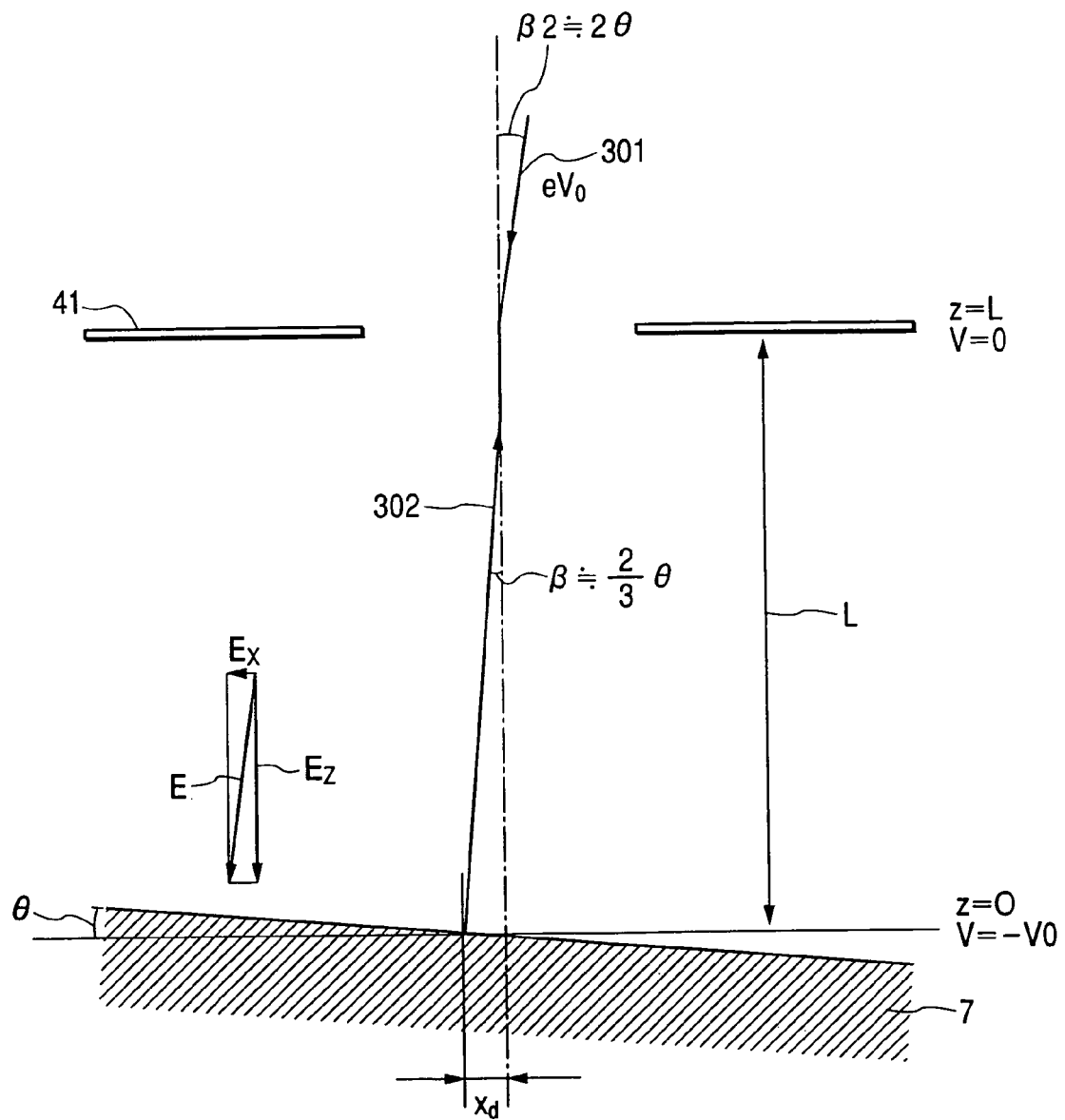
FIG. 28 is a diagram illustrating a configuration according to Tenth Embodiment of the present invention.

FIG. 28 illustrates a control process for ensuring the incident electron beam 301 to enter the sample vertically even if the sample wafer inclines.

Provided that the z direction is set as the optical axis and the sample surface is in a plane passing through the point z=0 and inclining at an angle of θ in the X direction in xyz rectangular coordinates, whereas the sample surface is in the xy plane where z=0 under normal $$\beta \cong \frac{2}{3}\theta$$

conditions, the z direction component Ez and X direction component Ex of a field intensity E are approximated at E and (1-z/L)E, respectively, wherein L is the distance between a sample 7 and an aperture lens electrode 41. By solving the equations of motion of electrons in the x and z directions, it is understood that the incident electron beam 301 enters the sample 7 approximately vertically whereas the incident electron beam 301 most approaches the sample 7 when the angle β of the incident electron beam 301 passing the aperture lens 41 approximately satisfies the following condition:

In addition, the focal distance f of the aperture lens 41 can be approximated at 4L when the diameter of the aperture of the aperture lens 41 is sufficiently lower than L. The incident electron beam 301 entering the aperture lens 41 has only to be inclined at an angle of 2 sin θ under this condition.

For example, the incident electron beam 301 can always be applied to the sample 7 vertically by arranging an aligner 42 between the objective lens 6 and the aperture lens 41 to ensure the incident electron beam 301 to incline at an angle of about 2θ when the sample inclines at an angle of θ in the X direction. The aligner 42 is preferably an electrostatic aligner so as to act upon the incident electron beam 301 and the mirror electron beam 302 in the same direction.

The variation in sample height is corrected in the following manner. The focal distance f of the aperture lens 41 is approximated at 4L, and a virtual image of the mirror electron beam reflected from the sample is formed at a point L/3 below the sample. The object plane of the objective lens 6 coincides with the virtual image plane of the aperture lens 41. The virtual image plane of the aperture lens 41 changes with a change in sample height and thereby changes the object plane of the objective lens 6. Accordingly, the image can be controlled to always keep its sharpness even if the sample height varies, by calculating L from the sample height, calculating the virtual image plane of the aperture lens 41, i.e., the object plane of the objective lens 6, and controlling the lens excitation of the objective lens 6 so as to keep the image plane of the objective lens 6 constant.

The height distribution of the semiconductor wafer 7 is determined prior to inspection upon several tens or more height measuring points using a height measuring means such as a height gauge 26. The inclination of a specific point of the sample can be obtained by dividing the difference in height between the specific point and an adjacent height measuring point by the distance between the two points. By averaging plural measurements on the inclination with adjacent plural height measuring points, the precision of the inclination measured can be improved. An inclination datum corresponding to an optional inspection point can be found by interpolation of the inclination data of the height measuring point. Upon actual inspection, the intensity (excitation) of the aligner 42 is controlled based on the data on the wafer inclination corresponding to the inspection position coordinates to thereby apply the incident electron beam 301 always vertically to the sample 7 within the wafer plane.

While the present invention has been described with reference to what are presently considered to be the preferred embodiments, it is to be understood that the invention is not limited to the disclosed embodiments. On the contrary, the invention is intended to cover various modifications and equivalent arrangements included within the sprit and scope of the appended claims. The scope of the following claims is to be accorded the broadest interpretation so as to encompass all such modifications and equivalent structures and functions.

What is claimed is:

1. A sample inspection apparatus for inspecting a wafer carrying an insulator on a surface of the wafer, the apparatus comprising:
   a sample stage to hold a sample to be inspected;
   a first electron optical system to direct to the sample an area electron beam that is formed to spread over a two-dimensional area of the sample;
   means for applying a voltage to the sample thus forming a surface potential on the sample to reflect the directed area electron beam without reaching to the sample;
   an image detection unit to detect the reflected area electron beam and to form a first image according to a potential distribution of the sample;
   an image processing unit to detect a defect existing in the first sample by analyzing information of the potential distribution based on the obtained first image, and to record a position of the defect;
   a second electron optical system to obtain a scanning electron microscopic (SEM) image by irradiating the recorded position of the defect with an electron probe beam configured to scan the sample with respect to the recorded position of the defect and detecting a secondary generated charged particle; and
   a pre-charge control unit for controlling a charged state of the sample prior to the first image being formed, wherein said charged state of the sample is controlled to reflect a potential distortion between a potential at a normal portion in the sample and a potential at a faulty portion in the sample, and wherein said pre-charge control unit includes an electron gun to irradiate an electron beam along an optical axis separated from respective optical axes of said first and said second electron optical systems to the sample, and a grid arranged between the electron gun and the sample to control said charged state of the sample due to the voltage applied to the grid.

2. A sample inspection apparatus for inspecting a wafer carrying an insulator on a surface of the wafer, the apparatus comprising:
   a sample stage to hold a sample to be inspected;
   a first electron optical system to direct to the sample an area electron beam that is formed to spread over a two-dimensional area of the sample;
   means for generating an electric field so that the directed area electron beam is reflected in a vicinity of the sample;
   a second electron optical system to form a first image according to a potential distribution of an area that the area electron beam is directed;
   means for detecting the first image in a form of an image signal;
   means for processing the image signal to detect a position of a defect existing in the electron beam irradiated area;
   a third electron optical system to obtain a scanning electron microscopic (SEM) image by irradiating the detected defect position with an electron probe beam configured to scan the sample with respect to the detected defect position and detecting a secondary generated charged particle; and
   a pre-charge control unit for controlling a charged state of the sample prior to the first image being formed, wherein said charged state of the sample is controlled to reflect a potential distortion between a potential at a normal portion in the sample and a potential at a faulty portion in the sample, and wherein said pre-charge control unit includes an electron gun to irradiate an electron beam along an optical axis separated from respective optical axes of said first, said second, and said third electron optical systems to the sample, and a grid arranged between the electron gun and the sample to control said charged state of the sample due to the voltage applied to the grid.

3. A sample inspection apparatus for inspecting a wafer carrying an insulator on a surface of the wafer, the apparatus comprising:
   a sample stage to hold a sample to be inspected;
   an illumination optical system to direct to the sample an area electron beam;
   means for generating an electric field so that at least a portion of the directed electron beam is reflected without impacting the sample;
   an imaging optical system to detect the reflected electron beam so as to form a first image corresponding to a potential distribution of the irritated area;
   means for detecting the first image as an image signal;
   means for processing the image signal to detect a position of a defect existing in the sample;
   an electron optical system to obtain a scanning electron microscopic (SEM) image by irradiating the detected defect position with an electron probe beam configured to scan the sample with respect to the detected defect position and detecting a secondary generated charged particle; and
   a pre-charge control unit for controlling a charged state of the sample prior to the first image being formed, wherein said charged state of the sample is controlled to reflect a potential distortion between a potential at a normal portion in the sample and a potential at a faulty portion in the sample, and wherein said pre-charge control unit includes an electron gun to irradiate an electron beam along an optical axis separated from respective optical axes of said illumination electron optical system, said imaging optical system, and said electron optical system to the sample, and a grid arranged between the electron gun and the sample to control said charged state of the sample due to the voltage applied to the grid.

4. A sample inspection apparatus according to claim 1, wherein, by moving the sample stage, said sample is transferred from a first position to receive the area electron beam from the first electron optical system to a second position to receive the electron probe beam from the second electron optical system.

5. A sample inspection apparatus according to claim 2, wherein, by moving the sample stage, said sample is transferred from one position to receive the area electron beam from the first electron optical system to another position to receive the electron probe beam from the third electron optical system.

6. A sample inspection apparatus according to claim 3, wherein, by moving the sample stage, said sample is transferred from one position to receive the area electron beam by the illumination optical system to another position to receive the electron probe beam from the electron optical system.

7. A sample inspection apparatus according to claim 1, wherein said SEM image is utilized to check one pattern of wafers prior to inspection, setting of inspection conditions, and alignment in addition to observation of detected defects.

8. A sample inspection apparatus according to claim 2, wherein said SEM image is utilized to check one pattern of wafers prior to inspection, setting of inspection conditions, and alignment in addition to observation of detected defects.

9. A sample inspection apparatus according to claim 3, wherein said SEM image is utilized to check one pattern of wafers prior to inspection, setting of inspection conditions, and alignment in addition to observation of detected defects.

10. A sample inspection apparatus according to claim 1, wherein the SEM image has a resolution higher than that of the first image.

11. A sample inspection apparatus according to claim 1, wherein the image detection unit and the image processing unit are also used generate the SEM image.

12. A sample inspection apparatus according to claim 2, wherein the SEM image has a resolution higher than that of the first image.

13. A sample inspection apparatus according to claim 2, wherein the image detection unit and the image processing unit are also used generate the SEM image.

14. A sample inspection apparatus according to claim 3, wherein the SEM image has a resolution than that of the first image.

15. A sample inspection apparatus according to claim 3, wherein the image detection unit and the image processing unit are also used generate the SEM image.

16. A sample inspection apparatus according to claim 1, wherein the grid is arranged in the proximity of the surface of the sample.

17. A sample inspection apparatus according to claim 2, wherein the grid is arranged in the proximity of the surface of the sample.

18. A sample inspection apparatus according to claim 3, wherein the grid is arranged in the proximity of the surface of the sample.

* * * * *